(12) United States Patent
Nojiri

(10) Patent No.: US 6,445,210 B2
(45) Date of Patent: Sep. 3, 2002

(54) LEVEL SHIFTER

(75) Inventor: Naoki Nojiri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/777,575

(22) Filed: Feb. 7, 2001

(30) Foreign Application Priority Data

Feb. 10, 2000 (JP) ........................................ 2000-032976

(51) Int. Cl.[7] ........................................ H03K 19/0185
(52) U.S. Cl. ........................ 326/68; 326/70; 326/81
(58) Field of Search ........................... 326/56–58, 63, 326/68, 70, 71, 73, 74, 80, 81

(56) References Cited

U.S. PATENT DOCUMENTS

| 5,317,213 | A |   | 5/1994  | Sato et al.       |        |
|-----------|---|---|---------|-------------------|--------|
| 5,371,421 | A | * | 12/1994 | Kondoh et al.     | 326/73 |
| 5,444,396 | A |   | 8/1995  | Soneda            |        |
| 5,486,785 | A |   | 1/1996  | Blankenship       |        |
| 5,650,971 | A |   | 7/1997  | Longway et al.    |        |
| 5,781,026 | A | * | 7/1998  | Chow              | 326/68 |
| 5,892,371 | A | * | 4/1999  | Maley             | 326/68 |
| 5,969,984 | A |   | 10/1999 | Komiya et al.     |        |
| 6,011,421 | A | * | 1/2000  | Jung              | 326/68 |

FOREIGN PATENT DOCUMENTS

| EP | 0493092    | 7/1992 |
| JP | 7-106946   | 4/1995 |
| JP | 10-190438  | 7/1998 |

OTHER PUBLICATIONS

International Search Report (European Patent Office).

* cited by examiner

Primary Examiner—Don Phu Le
(74) Attorney, Agent, or Firm—McDermott, Will & Emery

(57) ABSTRACT

In a level shifter including a latch consisting of two p-channel transistors P1 and P2, when an input signal at a terminal IN changes from H- into L-level, an n-channel transistor N2 turns ON, thereby dropping a potential level at a node W2. However, since a p-channel transistor P4 is OFF, no short-circuit current flows from a high voltage supply VDD3 into the ground by way of the transistors P2 and N2. On the other hand, since n- and p-channel transistors N1 and P3 are OFF, both terminals of a node W1 are electrically isolated. But the high voltage supply VDD3 pulls the node W1 up to a high voltage level by way of the p-channel transistors P4 and P1 and another p-channel transistor P5 as a resistor. Accordingly, the capacitance to be driven by the n-channel transistors N1 and N2 can be reduced, thus shortening the delay.

41 Claims, 23 Drawing Sheets

LEVEL SHIFTER

BACKGROUND OF THE INVENTION

The present invention generally relates to a level shifter for translating logic levels, and more particularly relates to a level shifter that can substantially eliminate a short-circuit current, which usually flows when a signal changes its logic levels.

A latch-type level shifter is one of known level shifters. FIG. 32 illustrates a specific configuration for a level shifter of this type. As shown in FIG. 32, the level shifter includes two n-channel transistors 51 and 52, two cross-coupled p-channel transistors 53 and 54 and first and second inverters 55 and 56. Each of the p-channel transistors 53 or 54 has its gate connected to the drain of the other p-channel transistor 54 or 53. The first inverter 55 inverts the level of an input signal received at an input terminal IN and is powered by a voltage supply VDD supplying a relatively low voltage of 1.5 V, for example. All the components of the level shifter but the first inverter 55 are powered by another voltage supply VDD3 supplying a relatively high voltage of 3.3 V, for example. The n-channel transistors 51 and 52 are both grounded and receive signals with mutually complementary levels, i.e., the input signal at the input terminal IN and the output signal of the first inverter 55, i.e., the inverted version of the input signal, respectively. The p-channel transistors 53 and 54 have their sources connected to the high voltage supply VDD3 and their drains connected to the drains of the n-channel transistors 51 and 52, respectively. The second inverter 56 is connected to a second node W2 at which the n- and the p-channel transistors 52 and 54 are connected together. And the output of the second inverter 56 is connected to an output terminal OUT.

Hereinafter, it will be described how this level shifter operates. Suppose, in a static state, the input signal is at logical 1 level (i.e., equivalent to the level of the supply voltage VDD) and the inverted version thereof is at logical 0 level (i.e., equivalent to the level of the ground potential VSS, or 0 V). In the following description, the logical 1 and 0 levels will be called H- and L-levels, respectively. In such a state, the n- and p-channel transistors 51 and 54 are ON, while the n- and p-channel transistors 52 and 53 are OFF. Also, in this state, a first node W1, at which the n- and p-channel transistors 51 and 53 are connected together, is at the L-(VSS) level. On the other hand, the second node W2, at which the n- and p-channel transistors 52 and 54 are connected together, is at the H-(VDD3) level. Each pair of transistors 51 and 53 or 52 and 54 meets a complementary relationship. Accordingly, no current flows in this static state.

Thereafter, when the level shifter enters an operating state with the transition of the input signal to the L-(VSS) level, the n-channel transistors 51 and 52 turn OFF and ON, respectively, as shown in FIG. 33. As a result, a short-circuit current I flows from the high voltage supply VDD3 through the p- and n-channel transistors 54 and 52 in the ON state, and the potential level at the second node W2 starts to fall from the H-(VDD3) level. And when the potential level at the second node W2 becomes lower than the threshold voltage Vtp of the p-channel transistor 53, the p-channel transistor 53 turns ON. As a result, the potential level at the first node W1 rises, the drain current of the p-channel transistor 54 decreases and the potential level at the second node W2 further falls.

Finally, the potential levels at the first and second nodes W1 and W2 reach the H- and L-levels (i.e., VDD3 level and 0 V), respectively. Then, no short-circuit current flows anymore and the second inverter 56 inverts the output logic level. As a result, the level shifter enters a standby state, or prepares for the next level transition of the input signal. In the foregoing example, the input signal changes from the H- into the L-level. However, a similar statement is applicable to the opposite situation, i.e., where the input signal changes from the L- into the H-level.

In the known level shifter, however, the potential level at the second node W2 is changed by allowing the short-circuit current to flow through the p- and n-channel transistors 54 and 52 during its operation. Thus, the level shifter dissipates a greater power disadvantageously.

In view of this drawback, a level shifter for selectively interrupting the short-circuit current in accordance with the potential level transition at the output node W2 was proposed in Japanese Laid-Open Publication Nos. 10-190438 and 7-106946, for example. FIG. 34 illustrates a configuration for the level shifter of that type. As shown in FIG. 34, the level shifter includes not only all the components of the level shifter shown in FIG. 32 but also p-channel transistors 57 and 58 as current interrupting transistors, which are disposed between the high voltage supply VDD3 and the p-channel transistors 53 and 54, respectively. The level shifter further includes inverters 59, 60, 61 and 62 as delay devices and a latch 63 of a small size. A potential at the first node W1 is applied to the gate of one current interrupting transistor 57 by way of the inverters 59 and 60. A potential at the second node W2 is applied to the gate of the other current interrupting transistor 58 by way of the inverters 61 and 62. The latch 63 is connected between the first and second nodes W1 and W2 and includes two p-channel transistors 64 and 65. These transistors 64 and 65 have their sources connected to the high voltage supply and their drains connected to the first and second nodes W1 and W2, respectively. Also, each of these transistors 64 or 65 has its drain connected to the gate of the other transistor 65 or 64.

In this level shifter with the capability of interrupting the short-circuit current, while the input signal is at the H-level, for example, the potential level at the second node W2 is also at the H-(VDD3) level. In such a state, the current interrupting transistor 58 is OFF and the high voltage supply VDD3 is disconnected from the p-channel transistor 54. On the other hand, the potential level at the first node W1 is at the L-level (i.e., 0 V). In such a state, the p-channel transistor 53 and current interrupting transistor 57 are ON and the high voltage supply VDD3 is connected to the p-channel transistor 53.

When the input signal changes into the L-level, the level shifter enters an operating state. In that state, the n-channel transistor 51 turns OFF to disconnect the first node W1 from the ground. On the other hand, the n-channel transistor 52 turns ON to ground the second node W2. As a result, the potential level at the second node W2 falls. This potential drop is transmitted to the p-channel transistor 58 but its arrival is delayed for a predetermined amount of time by the two delay devices 61 and 62. During this delay, the potential drop at the second node W2 turns the p-channel transistor 53 ON to connect the high voltage supply VDD3 to the first node W1. As a result, the potential level at the first node W1 rises and the p-channel transistor 54 turns OFF. Thereafter, the current interrupting transistor 58 turns ON. Accordingly, even if the n-channel transistor 52 turns ON during this operation, no short-circuit current flows from the high voltage supply VDD3 through the p- and n-channel transistors 54 and 52. As a result, the power dissipation can be cut down. However, if the potential rise at the first node W1 turns the current interrupting transistor 57 OFF after the predetermined time delay, then the first node W1 might enter a high impedance state and the output might be indefinite. To avoid such an unwanted situation, the latch 63 turns its internal p-channel transistor 64 ON responsive to the potential drop at the second node W2. In this manner, the high voltage supply VDD3 is connected to the first node W1, thereby pulling up the first node W1.

In the level shifter with the short-circuit current interrupting capability, each of the p-channel transistors 64 and 65 in the latch 63 should have its gate length L and ON-state resistance both increased sufficiently so as to be operable even at a low voltage. However, the n-channel transistors 51 and 52 usually have a small operating current. Accordingly, the capacitance to be driven by these n-channel transistors 51 and 52 increases in that case. As a result, a long time delay is caused after the input signal has changed its logic level and before the logic level at the output terminal OUT of the level shifter changes.

Also, in the level shifter with the short-circuit current interrupting capability, the latch 63 is connected to the drains of the n-channel transistors 51 and 52. Accordingly, to change the logic level at the output terminal OUT, the drain potentials of these n-channel transistors 51 and 52 (i.e., the potentials at the nodes W1 and W2) should be changed all the way from the high supply voltage VDD3 into the ground potential VSS or vice versa. And this is another factor increasing the delay. Nevertheless, if the current-carrying capacity of the n-channel transistors 51 and 52 is increased to shorten the delay, then these n-channel transistors 51 and 52 should have their size increased. Particularly when the low supply voltage VDD is decreased, the current, flowing through these n-channel transistors 51 and 52, further decreases, and the size of these transistors 51 and 52 should be further increased. As a result, these transistors 51 and 52 will occupy even larger areas on the chip.

SUMMARY OF THE INVENTION

It is therefore an object of the present invention to provide a level shifter with the short-circuit current interrupting capability that can operate at high speeds, or at a minimum delay, without using the latch of a small size.

To achieve this object, a level shifter according to the present invention includes a resistor connected to respective nodes, at which current interrupting transistors and cross-coupled transistors are connected together, thereby pulling those nodes up to a high voltage using this resistor.

As an alternative means for accomplishing this object, another level shifter according to the present invention has no pair of cross-coupled transistors.

A level shifter according to the present invention includes first and second n-channel transistors, first and second cross-coupled p-channel transistors, current interrupting section and at least one resistor. Each of the n- and p-channel transistors includes first, second and control terminals. The first and second n-channel transistors receive an input signal and its complementary signal at their respective control terminals and are powered by a first voltage supply. The first terminals of the first and second n-channel transistors are grounded, while the second terminals thereof are connected to first and second nodes, respectively. The first terminals of the first and second p-channel transistors are connected to a second voltage supply, while the second terminals thereof are connected to the first and second nodes, respectively. The current interrupting section interrupts a short-circuit current by disconnecting the first or second p-channel transistor from the second voltage supply when the input signal changes its level. And the resistor connects the second voltage supply to the first or second node while the input signal is in a steady state.

In one embodiment of the present invention, the resistor preferably has a high resistance value so that a current, flowing from the second voltage supply through the resistor itself, has a value almost equal to zero.

In another embodiment of the present invention, the level shifter preferably further includes a next-stage inverter connected to the second node. And gate capacitances of the next-stage inverter and the first p-channel transistor are preferably set so small as to allow the potential level at the second node to fall quickly.

In still another embodiment, the second and fourth p-channel transistors preferably have such a size as allowing the potential level at the second node to rise quickly.

In the inventive level shifter, even if both terminals of the first or second node are disconnected in a steady state in which the input signal has a constant level, the first or second node is connected to the second voltage supply via the resistor and pulled up. Thus, the level shifter of the present invention needs no small-sized latch for the pull-up purposes. That is to say, the capacitance to be driven by the first and second n-channel transistors, which should change the logic levels of the pair of cross-coupled p-channel transistors (i.e., a latch), can be reduced. Accordingly, when the input signal changes its level, the potential level at the first or second node falls more quickly, or the delay shortens. As a result, the level shifter can operate at higher speeds. In addition, although the level shifter of the present invention needs the resistor for pull-up purposes, the resistor is much smaller in size than the latch of the small size. Thus, the area occupied by the resistor on the chip is much smaller than that occupied by the small-sized latch.

Particularly, the potential level can fall even more quickly at the second node. Accordingly, the delay can be further shortened and the level shifter can operate at even higher speeds.

Another level shifter according to the present invention includes first and second transistors, pre-charge circuit, level detector and pre-charge controller. Each of the first and second transistors includes first, second and control terminals. The first and second transistors receive an input signal and its complementary signal at their respective control terminals and are powered by a first voltage supply. The first terminals of the first and second transistors are grounded, while the second terminals thereof are connected to first and second nodes, respectively. The pre-charge circuit pre-charges the first and second nodes to a voltage level of a second voltage supply. The level detector detects a potential drop at the first and second nodes. And the pre-charge controller controls the pre-charge circuit.

In one embodiment of the present invention, capacitances of gates connected to the first and second nodes are set so small in the level detector as to allow the potential level at the first and second nodes to fall quickly.

The inventive level shifter includes a level detector with a high switching level for detecting a potential drop at the first or second node. Accordingly, when the potential level at the first or second node decreases to less than the switching level of the level detector, the detector detects the potential level to change the output logic levels. Thus, compared to the known level shifter in which the output logic level does not change until the potential level at the first or second node is pulled all the way up to a high voltage, the inventive level shifter can operate much faster with its power dissipation reduced considerably.

In addition, according to the present invention, the potential level can fall at the first or second node quickly enough because a smaller current flows from its associated gate into the first or second node. Thus, the delay can be shortened and the level shifter can operate much faster.

DESCRIPTION OF THE PREFERRED EMBODIMENTS

EMBODIMENT 1

Hereinafter, a level shifter according to a first embodiment of the present invention will be described with reference to the accompanying drawings.

Figure 1:
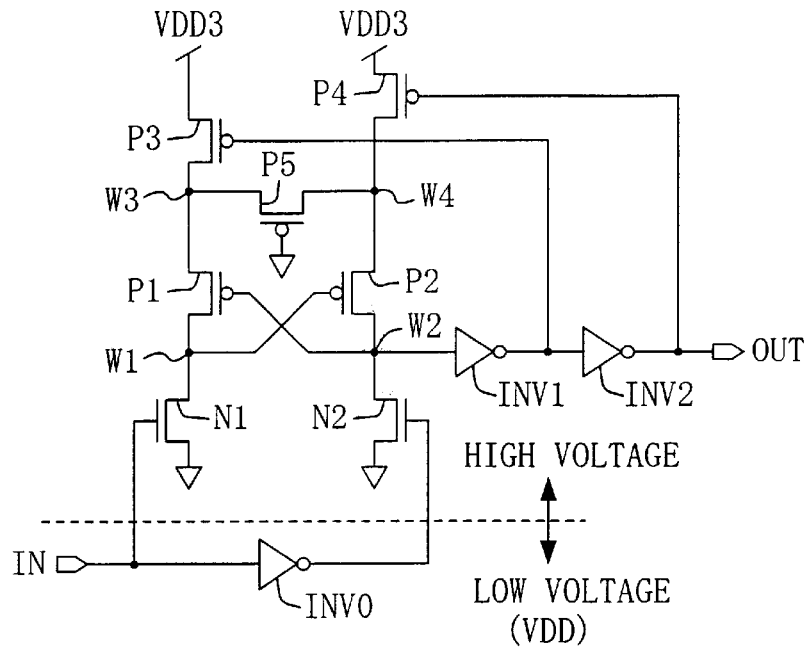
FIG. 1 is a circuit diagram illustrating a configuration for a level shifter according to a first embodiment of the present invention.

FIG. 1 illustrates a specific configuration for a level shifter according to the first embodiment.

As shown in FIG. 1, the level shifter includes an inverter INV0 for inverting the level of an input signal received at an input terminal IN. The inverter INV0 is powered by a voltage supply VDD supplying a relatively low voltage of 1.5 V, for example. The low voltage supply VDD is equivalent to the first voltage supply as defined in the claims. All the components of the level shifter shown in FIG. 1 but the inverter INV0 are powered by another voltage supply VDD3 supplying a relatively high voltage of 3.3 V, for example. The high voltage supply VDD3 is equivalent to the second voltage supply as defined in the claims.

The level shifter further includes first and second n-channel transistors N1 and N2. The n-channel transistors N1 and N2 have their sources grounded. The input signal received at the input terminal IN is input to the gate of the first n-channel transistor N1, while the output signal of the inverter IN0, i.e., inverted version of the input signal, is input to the gate of the second n-channel transistor N2. The level shifter further includes first and second p-channel transistors P1 and P2. Each of these p-channel transistors P1 or P2 has its gate cross-coupled to the drain of the other p-channel transistor P2 or P1. The drains of these p-channel transistors P1 and P2 are connected to the drains of the first and second n-channel transistors N1 and N2, respectively. A node, at which the first p-channel transistor P1 and first n-channel transistor N1 are connected together, will be herein called a "first node W1". A node, at which the second p-channel transistor P2 and second n-channel transistor N2 are connected together, will be herein called a "second node W2".

The level shifter further includes third and fourth p-channel transistors P3 and P4 as current interrupting transistors. The third and fourth p-channel transistors P3 and P4 together constitutes the current interrupting section as defined in the claims. The third and fourth p-channel transistors P3 and P4 have their sources connected to the high voltage supply VDD3 and their drains connected to the sources of the first and second p-channel transistors P1 and P2, respectively. A node, at which the first and third p-channel transistors P1 and P3 are connected together, will be herein called a "third node W3". A node, at which the second and fourth p-channel transistors P2 and P4 are connected together, will be herein called a "fourth node W4". The second node W2 is connected not only to the gate of the third p-channel transistor P3 by way of an inverter INV1, but also to the gate of the fourth p-channel transistor P4 by way of inverters INV1 and INV2. The output of the inverter INV2 is connected to an output terminal OUT.

The level shifter further includes a resistor, which is implemented as a p-channel transistor P5 with a grounded gate. And the other two terminals of the p-channel transistor P5 are connected to the third and fourth nodes W3 and W4, respectively.

Hereinafter, it will be described how the level shifter with such a configuration operates.

First, in a steady state in which the input signal at the input terminal IN is at the H-(VDD) level, the first n-channel transistor N1 and second p-channel transistor P2 are ON, while the second n-channel transistor N2 and first p-channel transistor P1 are OFF. The potential levels at the first and second nodes W1 and W2 are 0 V and the level of the high voltage supply VDD3 (i.e., 3.3 V), respectively. These states are the same as the known latch-type level shifter. Also, since the potential at the second node W2 is high (i.e., 3.3 V), the third and fourth p-channel transistors P3 and P4 are in ON and OFF states, respectively. The third p-channel transistor P3 in ON state connects the high voltage supply VDD3 to the fourth node W4 by way of the p-channel transistor P5, thereby pulling the fourth node W4 up to the level of the high voltage supply VDD3. As a result, the second node W2 is also pulled up to the level of the high voltage supply VDD3 by way of the second p-channel transistor P2 in ON state. Thus, even though the fourth p-channel transistor P4 and second n-channel transistor N2 are both OFF, the second and fourth nodes W2 and W4 will not enter the high-impedance state. Consequently, the logic level at the output terminal OUT is fixed at the H-(VDD3) level.

The input signal will soon change its level from H-(VDD) level into L-(VSS) level, thereby turning the second n-channel transistor N2 ON. Even so, since the fourth p-channel transistor P4 is OFF, no short-circuit current flows from the high voltage supply VDD3 through the second p-channel transistor P2 and second n-channel transistor N2. In this manner, the fourth p-channel transistor P4 functions as a current interrupting transistor.

Figure 2:
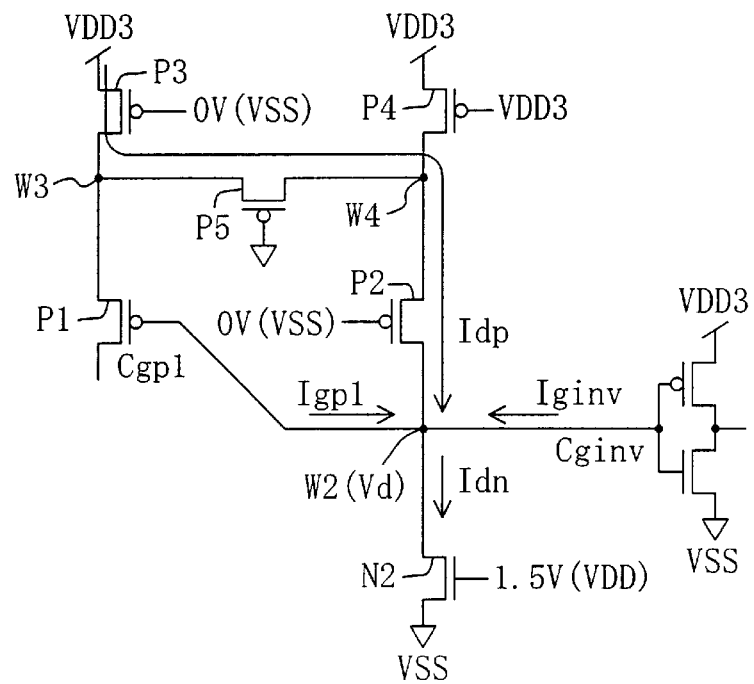
FIG. 2 illustrates currents flowing through the level shifter of the first embodiment just after an input signal has changed its level from H into L.

FIG. 2 illustrates currents flowing through the level shifter just after the input signal has changed its level from H into L. As described above, the second n-channel transistor N2 turns ON immediately after the input signal has changed from the H- into L-level. Accordingly, currents Igp1, Iginv and Idp flow into the second node W2. The current Igp1 discharges the gate capacitance Cgp1 of the first p-channel transistor P1. The current Iginv discharges the gate capacitance Cginv of the next-stage inverter INV1. And the short-circuit current Idp flows from the high voltage supply VDD3 into the second node W2 by way of the p-channel transistors P3, P5 and P2. On the other hand, a current Idn flows out of the second node W2 into the ground via the second n-channel transistor N2. Thus, the following relationship:

$$Iginv+Igp1=Idn-Idp$$

is met. In this case, the p-channel transistor P5 as the resistor should have a sufficiently high resistance to prevent the short-circuit current Idp from flowing. The resistance of the p-channel transistor P5 is adjusted along with those of the p-channel transistors P3 and P2 located on the path along which the short-circuit current flows. As can be seen from this equation, to make the short-circuit current Idp negligible and shorten the delay by allowing the potential level at the second node W2 to fall quickly enough, the current Idn should be increased and the currents Iginv and Igp1 should be decreased. That is to say, it is effective to reduce the gate capacitances Cgp1 and Cginv of the first p-channel transistor P1 and the next-stage inverter INV1.

Thereafter, when the first and second p-channel transistors P1 and P2 turn ON and OFF, respectively, the logic level of the latch, consisting of these transistors P1 and P2, is inverted. Then, the potential level at the output terminal OUT falls to the L-level (i.e., 0 V) after a predetermined time delay caused by the inverters INV1 and INV2. At the same time, the third and fourth p-channel transistors P3 and P4 turn OFF and ON, respectively. As a result, the level shifter enters a standby state, or prepares for the next level transition of the input signal. In this case, even though the fourth p-channel transistor P4 turns ON, no short-circuit current flows from the high voltage supply VDD3 through the transistors P4 and P2 because the second p-channel transistor P2 has already turned OFF. Furthermore, even though the third p-channel transistor P3 and first n-channel transistor N1 have both turned OFF, the fourth p-channel transistor P4 is ON. Accordingly, the high voltage supply VDD3 is connected to the third node W3 by way of the p-channel transistor P5. As a result, the fourth node W4 is pulled up to the level of the high voltage supply VDD3, so is the first node W1 through the first p-channel transistor P1 in ON state. In this manner, the unwanted situation where the first node W1 enters a high-impedance state is avoidable.

Next, suppose the input signal has changed from the L-(VSS) level into the H-(VDD) level. Then, the first n-channel transistor N1 turns ON. Even so, since the third p-channel transistor P3 is OFF, no short-circuit current flows from the high voltage supply VDD3 through the first p-channel transistor P1 and first n-channel transistor N1. In this manner, the third p-channel transistor P3 also functions as a current interrupting transistor.

Figure 3:
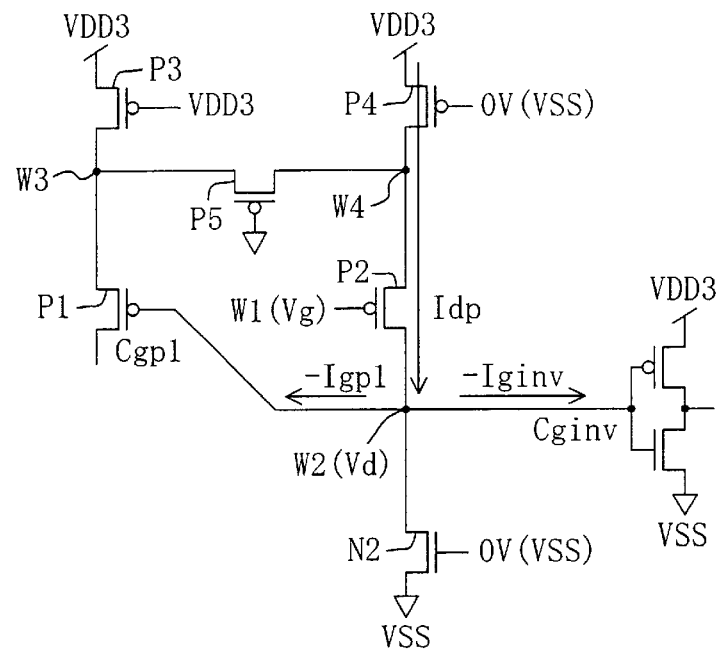
FIG. 3 illustrates currents flowing through the level shifter of the first embodiment just after the input signal has changed its level from L into H.

FIG. 3 illustrates currents flowing through the level shifter just after the input signal has changed its level from L into H. As described above, the second n-channel transistor N2 turns OFF immediately after the input signal has changed its level this way. Accordingly, currents −Igp1 and −Iginv flow out of the second node W2 and the current Idp flows into the second node W2. The current −Igp1 charges the gate capacitance Cgp1 of the first p-channel transistor P1. The current −Iginv charges the gate capacitance Cginv of the inverter INV1. And the current Idp flows from the high voltage supply VDD3 into the second node W2 by way of the p-channel transistors P4 and P2. Thus, the following relationship:

$$Iginv + Igp1 = Idp$$

is met. In this case, to shorten the delay, the current Idp should be increased and the currents Iginv and Igp1 should be decreased. That is to say, it is effective to increase the size of the fourth and second p-channel transistors P4 and P2 and reduce the gate capacitance Cginv of the next-stage inverter INV1.

As can be seen, the first and second p-channel transistots P1 and P2 should be of an optimum size so that a potential rise time is equal to a potential drop time at the second node W2. Also, to further reduce the delay, the size of the third and fourth p-channel transistors P3 and P4 should preferably be greater than that of the first and second p-channel transistors P1 and P2.

According to the first embodiment, the p-channel transistor P5 is connected as a resistor to the third and fourth nodes W3 and W4 to prevent the first and second nodes W1 and W2 from entering the high-impedance state. Thus, there is no need to connect the known small-sized latch to the first and second nodes W1 and W2. That is to say, the capacitance to be driven by the first and second n-channel transistors N1 and N2 can be reduced. As a result, the potential level can rise or fall more quickly at the second node W2 and the delay can be shortened effectively. In addition, the n-channel transistors N1 and N2 can be of a reduced size and just the p-channel transistor P5 is needed instead of the known small-sized latch. Consequently, this level shifter occupies a much smaller area on the chip.

Supposing the resistance of the p-channel transistor P5 is very high, the operating limit of the level shifter of the first embodiment is given by $$VDD \geq Vtn$$

where Vtn is the threshold voltage of the n-channel transistors N1 and N2. Thus, it is possible to afford a sufficient margin for its design process.

MODIFIED EXAMPLES

Figure 4:
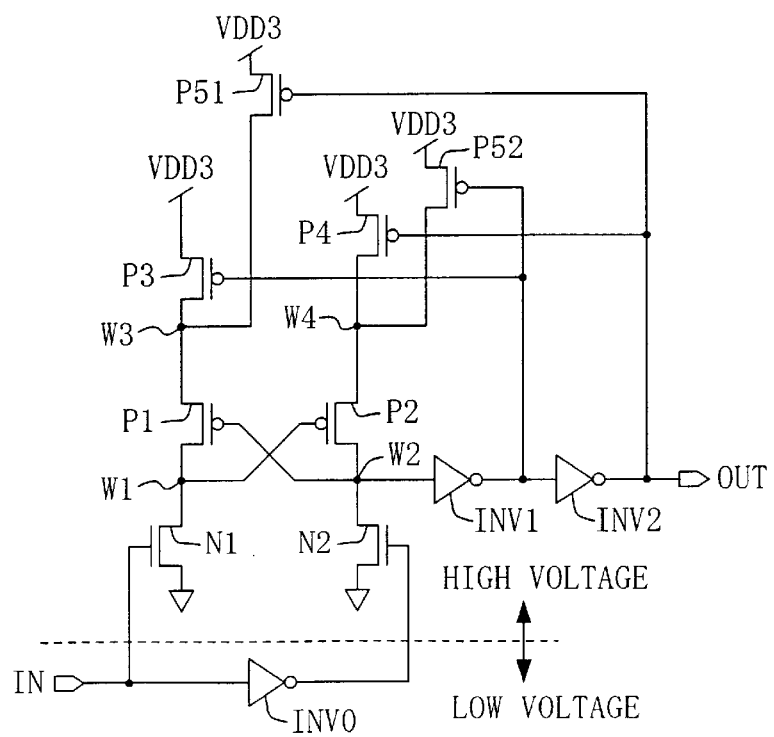
FIG. 4 is a circuit diagram illustrating a modified example with resistors at different positions for the level shifter of the first embodiment.
Figure 5:
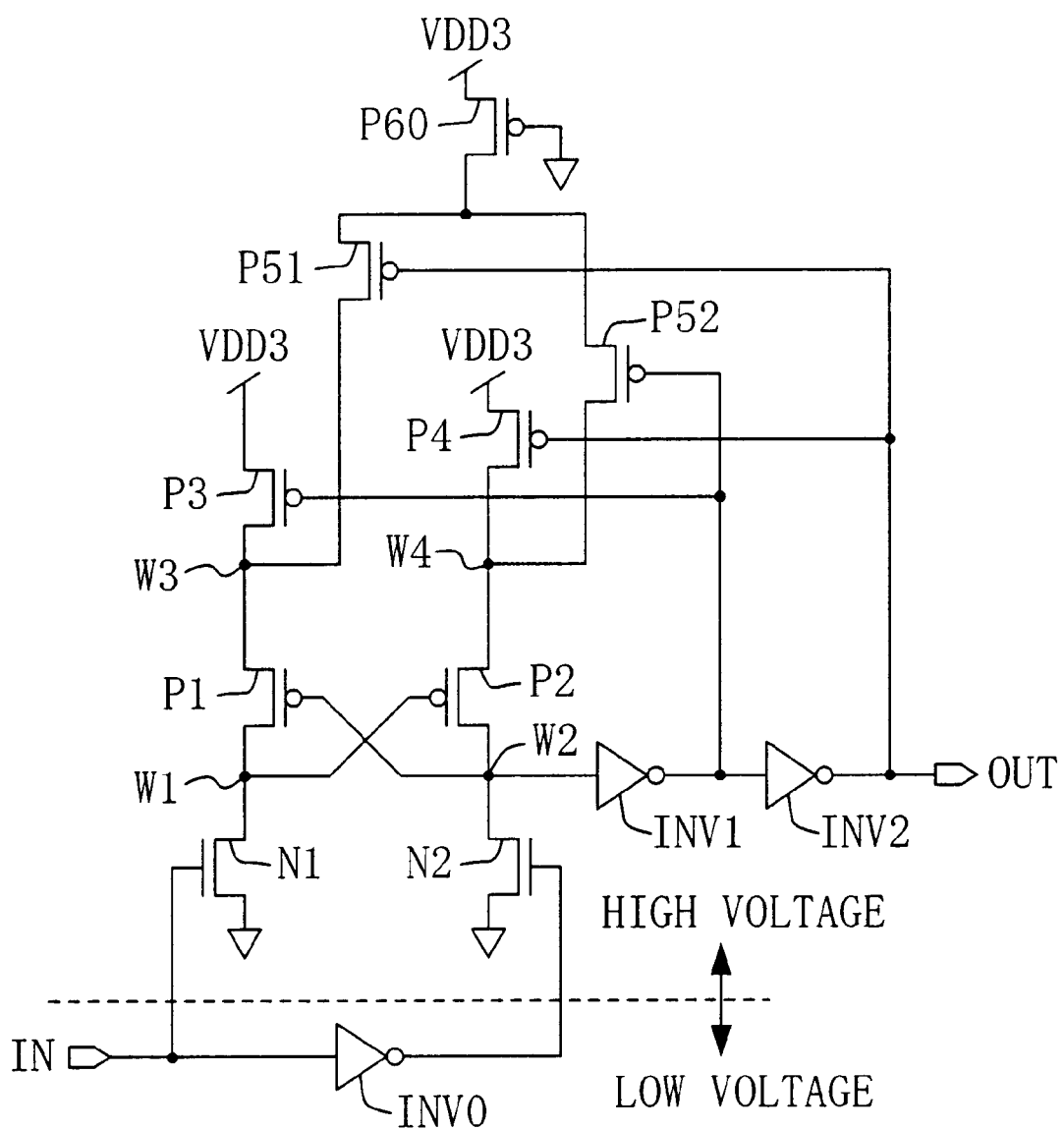
FIG. 5 is a circuit diagram illustrating another modified example for the level shifter of the first embodiment.
Figure 6:
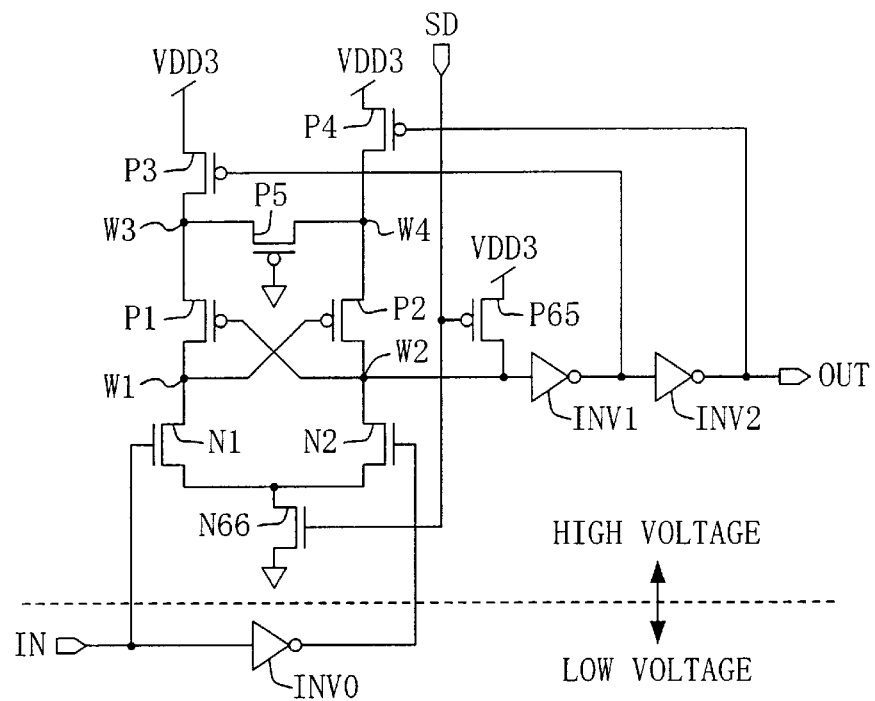
FIG. 6 is a circuit diagram illustrating a level shifter, which can fix the output logic level when an internal low voltage supply is shut down, as still another modified example for the level shifter of the first embodiment.

FIGS. 4, 5 and 6 illustrate modified examples for the first embodiment.

FIG. 4 illustrates a modified example including resistors (i.e., p-channel transistors) at different positions. In the first embodiment, while one of the third and fourth p-channel transistors (e.g., P4) is OFF, the other p-channel transistor (e.g., P3) is ON. By utilizing this level relationship, the second and fourth nodes W2 and W4 are pulled up to the level of the high voltage supply VDD3 by way of the p-channel transistor P3 in ON state. On the other hand, in this modified example, p-channel transistors P51 and P52 are provided as a resistor for pulling up the first and third nodes W1 and W3 and as a resistor for pulling up the second and fourth nodes W2 and W4, respectively. These p-channel transistors P51 and P52 (which are equivalent to the first and second resistors as defined in the claims) are both connected to the high voltage supply VDD3. And using a control signal, obtained by inverting the level of a control signal for the third and fourth p-channel transistors P3 and P4, these p-channel transistors P51 and P52 are controlled so as to turn ON while the p-channel transistors P3 and P4 are OFF. That is to say, the third and fourth p-channel transistors P3 and P4 are controlled using the inverted version of the potential level at the second node W2, while the p-channel transistors P51 and P52 are controlled using the potential level at the second node W2. These p-channel transistors P51 and P52 perform the same function as the p-channel transistor P5 of the first embodiment, and the description thereof will be omitted herein.

FIG. 5 illustrates a further modification to the modified example shown in FIG. 4. Specifically, in the level shifter shown in FIG. 5, the p-channel transistors P51 and P52, i.e., resistors for pulling up the respective nodes, are connected to the high voltage supply VDD3 via another p-channel transistor P60 as a resistor. The level shifter of this modified example performs the same function as the counterpart shown in FIG. 4.

FIG. 6 illustrates a level shifter that can fix the output logic level when an internal low voltage supply is shut down. The level shifter shown in FIG. 6 includes not only all the components of the level shifter shown in FIG. 1 but also an input terminal SD, at which a shutdown instruction signal is received, and additional p- and n-channel transistors P65 and N66. The p-channel transistor P65 is connected to the high voltage supply VDD3 and second node W2 and receives an L-level shutdown instruction signal at its gate from the input terminal SD. The n-channel transistor N66 has its drain connected to the sources of the first and second n-channel transistors N1 and N2, has its source grounded and receives the shutdown instruction signal at its gate from the input terminal SD.

Thus, in this modified example, when the low voltage supply should be shut down, the n-channel transistor N66 is turned OFF to disconnect the second node W2 from the ground, and the p-channel transistor P65 is turned ON to connect the second node W2 to the high voltage supply VDD3. In this manner, the logic level at the output terminal OUT can be fixed at the H-(VDD3) level.

EMBODIMENT 2

Hereinafter, a level shifter according to a second embodiment of the present invention will be described with reference to FIG. 7.

Figure 7:
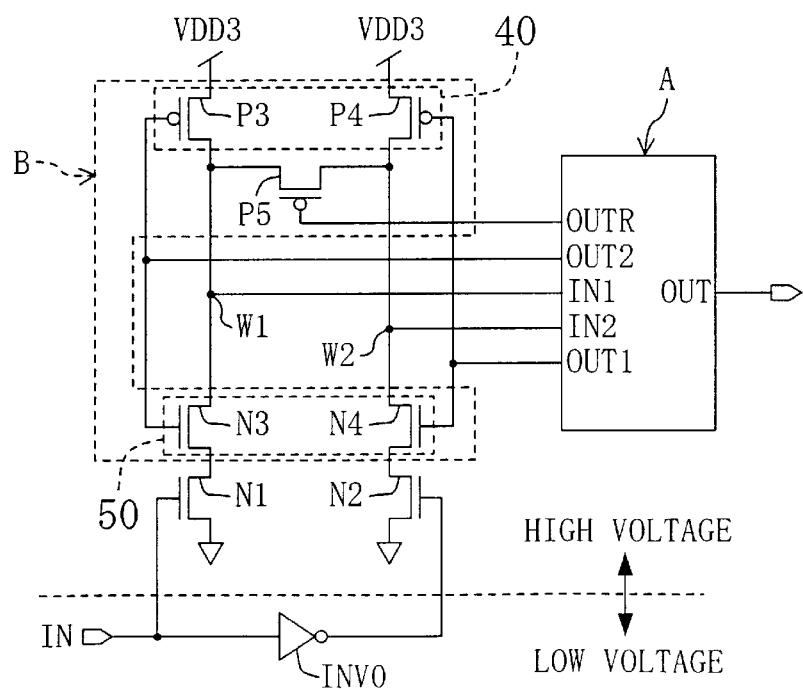
FIG. 7 is a circuit diagram illustrating a schematic configuration for a level shifter according to a second embodiment of the present invention.

FIG. 7 illustrates a schematic configuration for a level shifter according to the second embodiment. Unlike the level shifter of the first embodiment, the level shifter of the second embodiment does not use the latch, consisting of the two cross-coupled p-channel transistors, for the level translation purposes.

As shown in FIG. 7, the level shifter includes an inverter INV0 for inverting the level of an input signal received at an input terminal IN. The inverter INV0 is powered by a voltage supply VDD supplying a relatively low voltage. The low voltage supply VDD is equivalent to the first voltage supply as defined in the claims. All the components of the level shifter shown in FIG. 7 but the inverter INV0 are powered by another voltage supply VDD3 supplying a relatively high voltage. The high voltage supply VDD3 is equivalent to the second voltage supply as defined in the claims.

The level shifter further includes first and second n-channel transistors N1 and N2 receiving respective signals with mutually complementary levels. That is to say, the signal received at the input terminal IN is input to the gate of the first n-channel transistor N1, while the output signal of the inverter IN0, i.e., inverted version of the input signal, is input to the gate of the second n-channel transistor N2. The n-channel transistors N1 and N2 have their sources grounded and their drains connected to first and second nodes W1 and W2. Accordingly, while one of these n-channel transistors N1 or N2 is ON, the first or second node W1 or W2 is grounded so as to have the potential level at the node W1 or W2 decreased to the L-level (i.e., 0 V). The first and second n-channel transistors N1 and N2 are exemplary first and second transistors as defined in the claims. It should be noted that although the first and second transistors are of n-channel type in this embodiment, a pair of p-channel transistors may be used as the first and second transistors.

As shown in FIG. 7, the level shifter further includes a pre-charge circuit B, which includes supply circuit 40, interrupter 50 and p-channel transistor P5 as a resistor. The supply circuit 40 is made up of third and fourth p-channel transistors P3 and P4. And the interrupter 50 is made up of third and fourth n-channel transistors N3 and N4. The third and fourth n-channel transistors N3 and N4 are equivalent to the first and second n-channel transistors as defined in the claims. The third p-channel transistor P3 has its source connected to the high voltage supply VDD3 and its drain connected to the first node W1. The third p-channel transistor P3 is equivalent to the first p-channel transistor of a level shifter according to the second aspect of the present invention. The fourth p-channel transistor P4 also has its source connected to the high voltage supply VDD3 and its drain connected to the second node W2. The fourth p-channel transistor P4 is equivalent to the second p-channel transistor of the level shifter according to the second aspect of the present invention. While the third or fourth p-channel transistor P3 or P4 is ON, the high voltage supply VDD3 is connected to the first or second node W1 or W2, thereby pre-charging the node W1 or W2 to the level of the high voltage supply VDD3.

Also, in the pre-charging circuit B, the third n-channel transistor N3 is disposed between the first node W1 and first n-channel transistor N1, while the fourth n-channel transistor N4 is disposed between the second node W2 and second n-channel transistor N2. While the third or fourth p-channel transistor P3 or P4 is pre-charging its associated node W1 or W2, the third or fourth n-channel transistor N3 or N4 prevents its associated node W1 or W2 from being grounded by way of the first or second n-channel transistor N1 or N2. Furthermore, the p-channel transistor P5 is connected as a resistor to the drains of the third and fourth p-channel transistors P3 and P4 (and to the first and second nodes W1 and W2). As in the first embodiment, the p-channel transistor P5 connects the high voltage supply VDD3 to the first or second node W1 or W2 to prevent the first or second node W1 or W2 from entering the high-impedance state.

As shown in FIG. 7, the level shifter further includes a control circuit A. The control circuit A detects the drop of the potential level at the first or second node W1 or W2 to the L-level (i.e., 0 V) and then pre-charges the first or second node W1 or W2 to the H-(VDD3) level. An exemplary internal configuration for the control circuit A is illustrated in FIG. 8.

Figure 8:
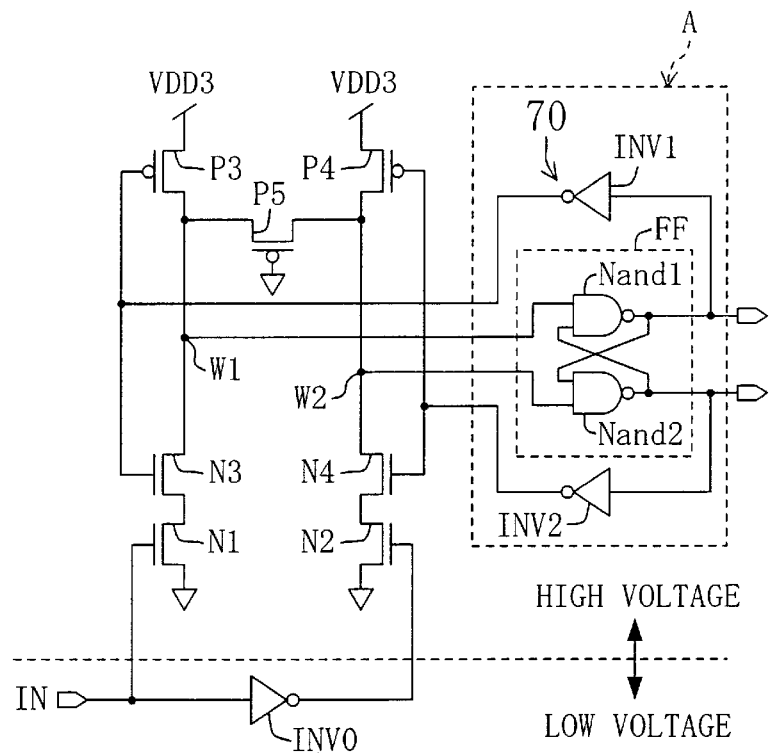
FIG. 8 is a circuit diagram illustrating a specific configuration for the level shifter of the second embodiment.

As shown in FIG. 8, the control circuit A includes a flip-flop FF and a pre-charge controller 70 consisting of two inverters INV1 and INV2. The flip-flop FF is equivalent to the level detector as defined in the claims, and includes first and second two-input NAND gates Nand1 and Nand2. The first NAND gate Nand1 receives the potential at the first node W1 and the output signal of the second NAND gate Nand2. The second NAND gate Nand2 receives the potential at the second node W2 and the output signal of the first NAND gate Nand1. And the output signals of these NAND gates Nand1 and Nand2 are outputs of the flip-flop FF. Accordingly, if the potential level at the first node W1 is at the L-level (i.e., 0 V), the output signals of the first and second NAND gates Nand1 and Nand2 are at the H-(VDD3) level and at the L-level (i.e., 0 V), respectively. On the other hand, if the potential level at the second node W2 is at the L-level (i.e., 0 V), the output signals of the first and second NAND gates Nand1 and Nand2 are at the L-level (i.e., 0 V) and at the H-(VDD3) level, respectively.

The pre-charge controller 70 included in the control circuit A controls the pre-charge operation of the pre-charge circuit B. On receiving the output of the first NAND gate Nand1 of the flip-flop FF, the inverter INV1 inverts the signal received and outputs its inverted signal to the gates of the p- and n-channel transistors P3 and N3 of the pre-charge circuit B. On receiving the output of the second NAND gate Nand2 of the flip-flop FF, the inverter INV2 inverts the signal received and outputs its inverted signal to the gates of the p- and n-channel transistors P4 and N4 of the pre-charge circuit B.

Hereinafter, it will be described how the level shifter of the second embodiment operates.

In a steady state, the potential levels at the first and second nodes W1 and W2 are both at the H-(VDD3) level. If the input signal is also at the H-(VDD3) level, the first and second n-channel transistors N1 and N2 turn ON and OFF, respectively. The two outputs of the flip-flop FF (i.e., the outputs of the first and second NAND gates Nand1 and Nand2) remain at the H-(VDD3) level and at the L-level (0 V), respectively. In such a state, the third n-channel transistor N3 and fourth p-channel transistor P4 are OFF, while the fourth n-channel transistor N4 and third p-channel transistor P3 are ON. The first and third n-channel transistors N1 and N3 and the second and fourth n-channel transistors N2 and N4 have mutually complementary logic levels.

Figure 9:
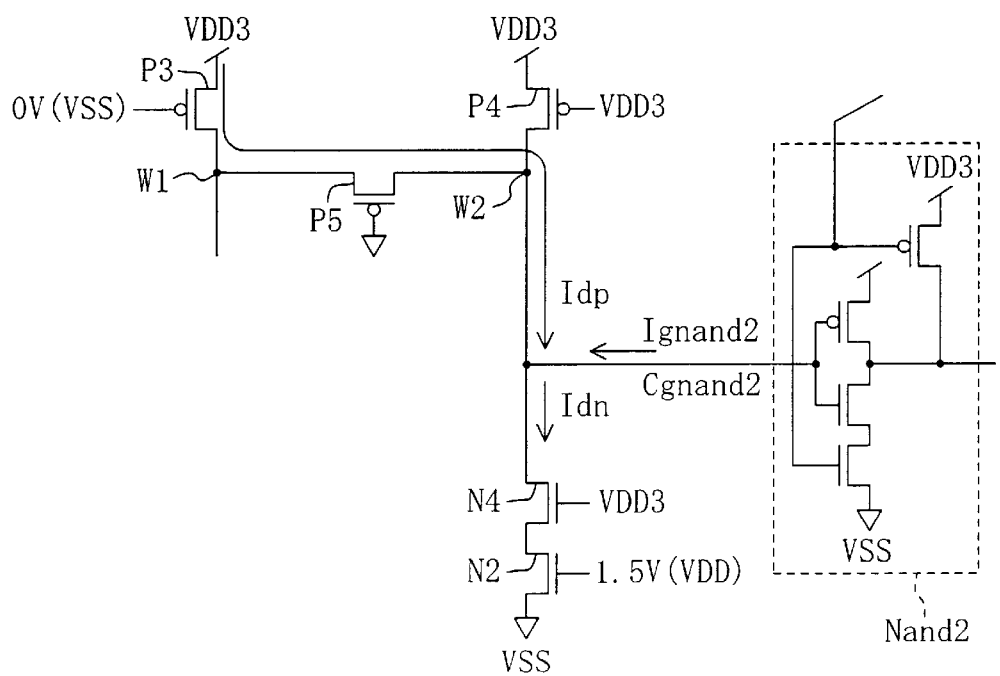
FIG. 9 illustrates currents flowing through the level shifter of the second embodiment just after an input signal has changed its level from H into L.

Suppose the input signal has changed its level from H (VDD3) into L (0 V) in such a state. Then, the second n-channel transistor N2 turns ON. At this time, in the pre-charge circuit B, the fourth n-channel transistor N4 is ON but the p-channel transistor P4 is OFF. Thus, no short-circuit current flows from the high voltage supply VDD3 into the ground by way of these three transistors P4, N4 and N2. In that case, currents flow as shown in FIG. 9. Specifically, just after the input signal has changed its level, the n-channel transistor N2 turns ON. Accordingly, a current Idn flows out of the second node W2 into the ground by way of the n-channel transistors N4 and N2. And currents Ignand2 and Idp flow into the second node W2. The current Ignand2 discharges the gate capacitance Cgnand2 of the second NAND gate Nand2 in the flip-flop FF. The current Idp flows through the p-channel transistors P3 and P5. Accordingly, the following relationship $$Ignand2 = Idn - Idp$$

is met. Supposing no short-circuit current Idp flows (i.e., if the resistance of the p-channel transistor P5 is very high), the short-circuit current Idp is negligible. Accordingly, to shorten the delay by allowing the potential level at the second node W2 to drop quickly, the current Idn should be increased and the current Ignand2 should be decreased. Specifically, it is effective to reduce the gate capacitance Cgnand2 of the second NAND gate Nand2 in the flip-flop FF. Also, the current Idp flows through the two transistors P3 and P5, and can be decreased easily.

Thereafter, the potential level at the second node W2 goes on dropping and the output logic levels of the flip-flop FF will soon be inverted. That is to say, the outputs of the first and second NAND gates Nand1 and Nand2 will have the L-(0 V) level and H-(VDD3) level, respectively. Then, the n-channel transistor N4 turns OFF and the p-channel transistor P4 turns ON. As a result, the second node W2 is pre-charged by the high voltage supply VDD3 to the H-(VDD3) level. This pre-charge operation is performed quickly enough by the p-channel transistor P4. On the other hand, the p-channel transistor P3 turns OFF to stop pre-charging the first node W1 to the level of the high voltage supply VDD3. But the n-channel transistor N3 turns ON to connect the first node W1 to the n-channel transistor N1 in OFF state. As a result, the level shifter enters a standby state to prepare for the next level transition of the input signal. In such a state, the high voltage is supplied from the high voltage supply VDD3 to the first node W1 by way of the p-channel transistor P4 in ON state and the p-channel transistor P5. Accordingly, the potential level at the first node W1 becomes the H-(VDD3) level. Consequently, even though the p- and n-channel transistors P3 and N1 are OFF, the first node W1 does not enter the high-impedance state.

The level shifter operates in a similar manner after the input signal has changed from the L-(0 V) level into the H(VDD3) level. Thus, the description thereof will be omitted herein.

In this embodiment, the two NAND gates Nand1 and Nand2 of the flip-flop FF should have a high switching level. Accordingly, when the n-channel transistor N1 or N2 is ON, there is no need to drop the potential level at the associated first or second node W1 or W2 all the way from the H-(VDD3) level down to the L-(0 V) level. Thus, compared to the known level shifter requiring a full swing like that, the level shifter of the second embodiment can operate at higher speeds with its power dissipation reduced.

Also, each of the n-channel transistors N1 or N2 has to drive just the gate capacitance of its associated NAND gate Nand1 or Nand2, and therefore can have its size reduced. As a result, these transistors N1 and N2 occupy reduced areas on the chip.

Supposing the resistance of the p-channel transistor P5 as a resistor is very high, the operating limit of the level shifter of the second embodiment is given by $$VDD \geq Vtn$$

Thus, it is possible to afford a sufficient margin for its design process.

Modified Example 1

Figure 10:
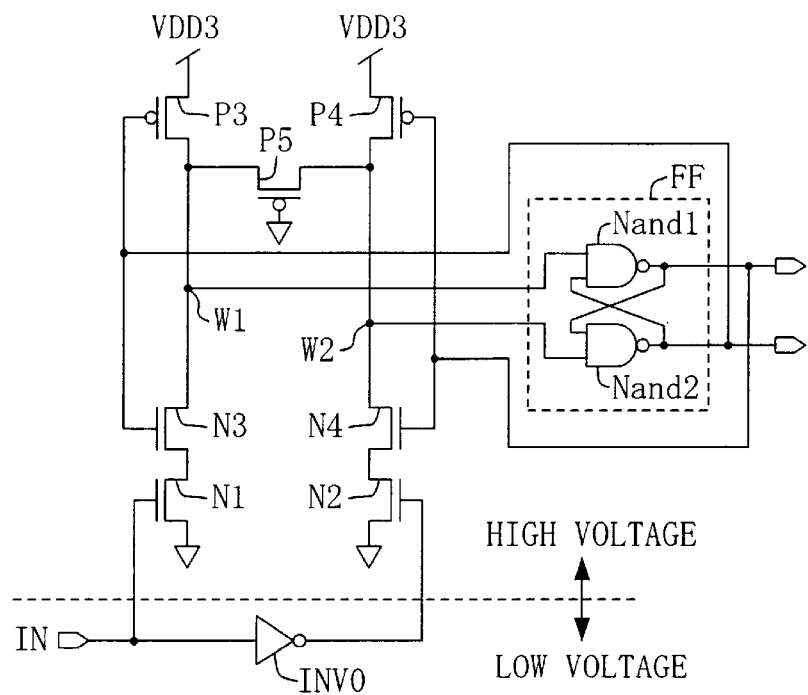
FIG. 10 is a circuit diagram illustrating a first modified example, including a modified pre-charge controller, for the level shifter of the second embodiment.
Figure 11:
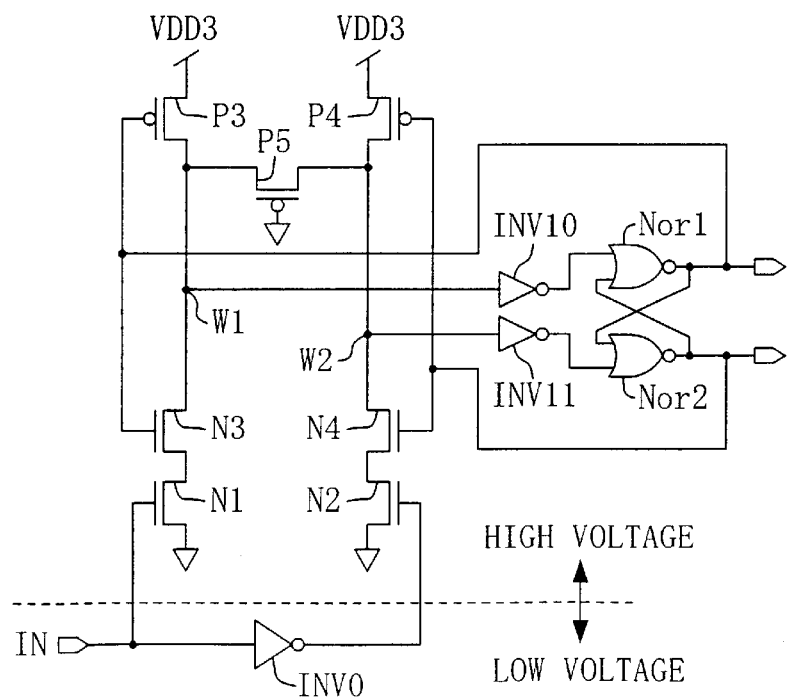
FIG. 11 is a circuit diagram also illustrating the first modified example, including a modified flip-flop, for the level shifter of the second embodiment.
Figure 12:
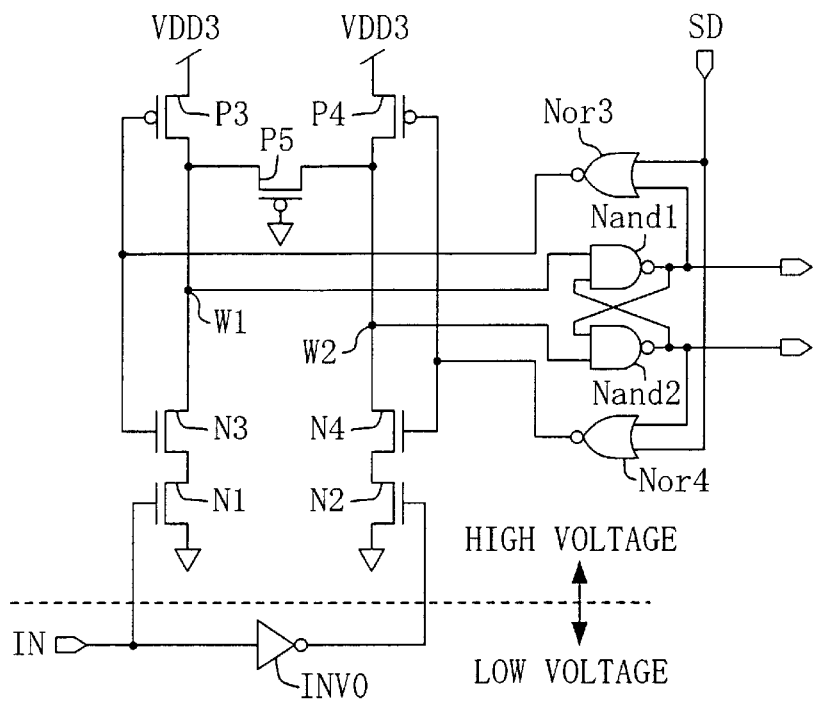
FIG. 12 is a circuit diagram illustrating a level shifter, which can fix the logic levels when a low voltage supply is shut down, as a second modified example for the level shifter of the second embodiment.

FIGS. 10 and 11 illustrate a first modified example for the level shifter of the second embodiment. In the level shifter shown in FIG. 10, the control circuit A is made up of a smaller number of transistors compared to the counterpart shown in FIG. 8. Specifically, in the level shifter shown in FIG. 10, the two inverters INV1 and INV2 are omitted from the control circuit A. Also, the p- and n-channel transistors p3 and N3 are controlled by the output of the second NAND gate Nand2 and the p- and n-channel transistors P4 and N4 are controlled by the output of the first NAND gate Nand1.

Accordingly, using the smaller number of transistors, the level shifter shown in FIG. 10 can perform the same operation as the counterpart shown in FIG. 8.

In the level shifter shown in FIG. 11, the flip-flop consists of two NOR gates Nor1 and Nor2, and inverters INV10 and INV11 are disposed on the stage preceding these NOR gates Nor1 and Nor2. Like the level shifter shown in FIG. 10, the level shifter shown in FIG. 11 does not include the two inverters INV1 and INV2 as the pre-charge controller 70, either. Accordingly, the level shifter shown in FIG. 11 can perform the same operation as the counterpart shown in FIG. 8. In addition, since the inverters INV10 and INV11 are provided, the capacitance to be driven by the NOR gates Nor1 and Nor2 can be reduced. As a result, the flip-flop can operate at higher speeds.

Modified Example 2

FIGS. 12 through 16 illustrate a second modified example for the second embodiment. The level shifter shown in FIG. 12 has the capability of fixing the output logic levels of the flip-flop when the low voltage supply VDD is shut down. In other words, the output logic levels of the flip-flop remain the same before and after the shutdown. Specifically, responsive to an H-(VDD3) level shutdown instruction signal received at a terminal SD, two NOR gates Nor3 and Nor4 get the pre-charge circuit B operated, thereby fixing the first and second nodes W1 and W2 at the H-(VDD3) level. In this manner, the output logic levels of the two NAND gates Nand1 and Nand2 of the flip-flop are also fixed.

Figure 13:
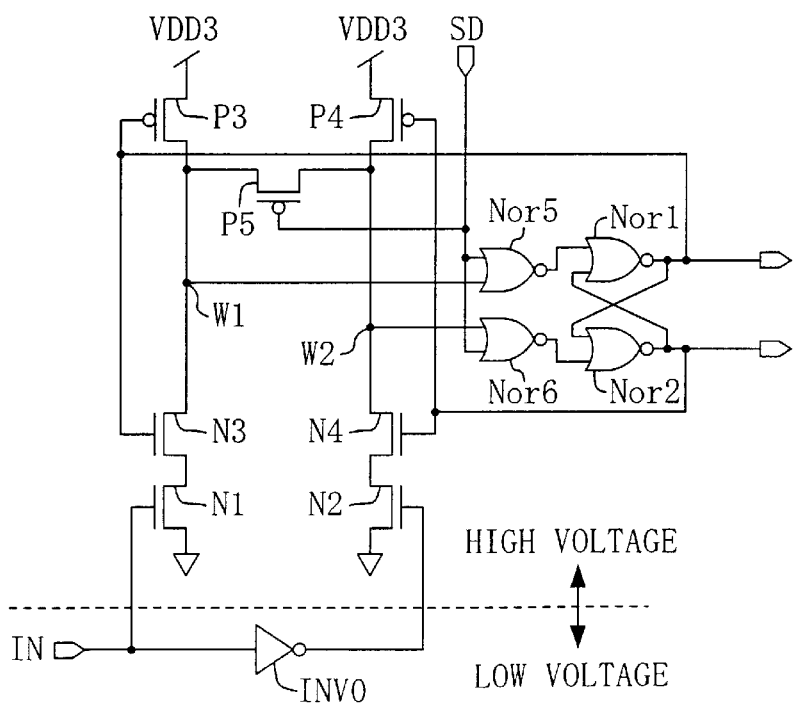
FIG. 13 is a circuit diagram illustrating an alternative configuration for the level shifter of the second modified example.

The level shifter shown in FIG. 13 also has the capability of fixing the output logic levels of the flip-flop when the low voltage supply VDD is shut down. The level shifter shown in FIG. 13 is different from the counterpart shown in FIG. 12 in that the flip-flop is made up of two NOR gates Nor1 and Nor2. Also, responsive to the H-(VDD3) level shutdown instruction signal at the terminal SD, NOR gates Nor5 and Nor6 fix the outputs of the NOR gates Nor1 and Nor2 at the logic levels before the low voltage supply is shut down, whether the first and second nodes W1 and W2 are high or low. Furthermore, in the level shifter shown in FIG. 13, the p-channel transistor P5 is turned OFF responsive to the H-(VDD3) level shutdown instruction signal. This is to prevent the short-circuit current from flowing through the p- and n-channel transistors P3, P5, N4 and N2 in ON state.

Figure 14:
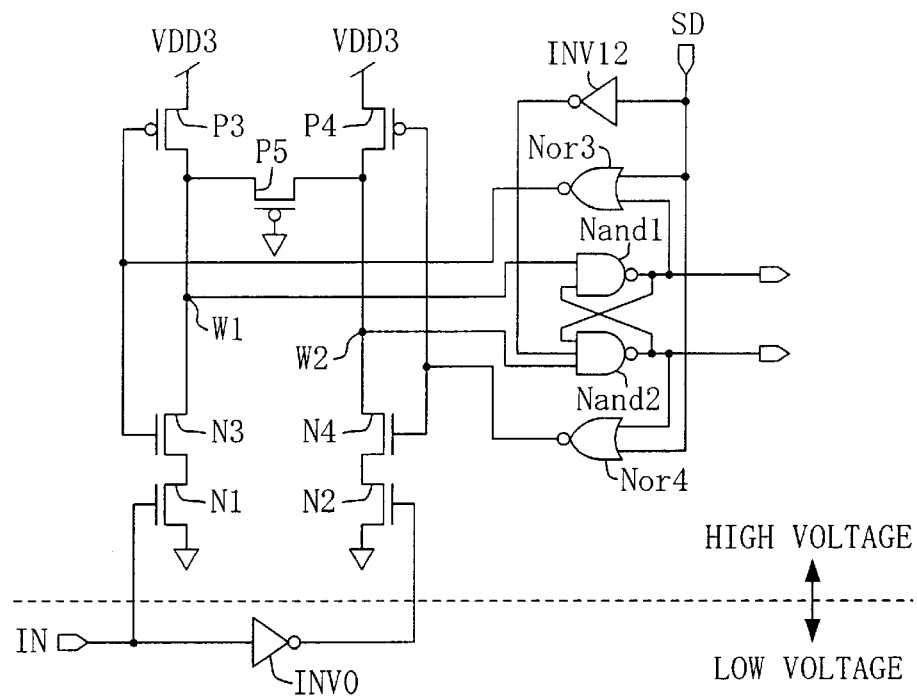
FIG. 14 is a circuit diagram illustrating another alternative configuration for the level shifter of the second modified example.

In the level shifter shown in FIG. 14, when the low voltage supply VDD is shut down, the output logic levels of the NAND gates Nand1 and Nand2 of the flip-flop are compulsorily fixed at the L-(0 V) and H-(VDD3) levels, respectively. Specifically, the level shifter shown in FIG. 14 further includes another inverter INV12 in addition to all the components of the level shifter shown in FIG. 12. The H-(VDD3) level shutdown instruction signal received at the terminal SD is inverted by the inverter INV12. And the inverted signal is input to the second NAND gate Nand2, thereby fixing the output of the NAND gate Nand2 at the H-(VDD3) level. The shutdown instruction signal is delivered through the NOR gate Nor3 to the p- and n-channel transistors P3 and N3 and through the NOR gate Nor4 to the p- and n-channel transistors P4 and N4, respectively. As a result, the potential levels at the first and second nodes W1 and W2 are fixed at the H-(VDD3) level.

Figure 15:
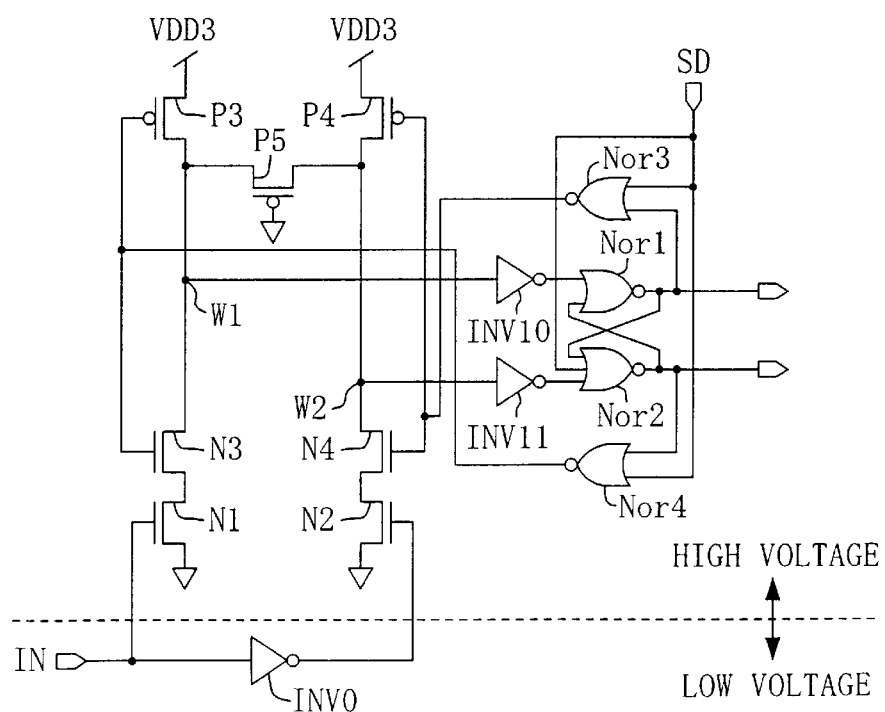
FIG. 15 is a circuit diagram illustrating still another alternative configuration for the level shifter of the second modified example.

The level shifter shown in FIG. 15 is a modification to the counterpart shown in FIG. 14. Specifically, the flip-flop of the level shifter shown in FIG. 15 is made up of two NOR gates Nor1 and Nor2 and two inverters INV10 and INV11. Also, the inverter INV12 is omitted from the level shifter shown in FIG. 15 so that the shutdown instruction signal is directly input to the NOR gate Nor2. The level shifter shown in FIG. 15 can perform the same function as the counterpart shown in FIG. 14.

Figure 16:
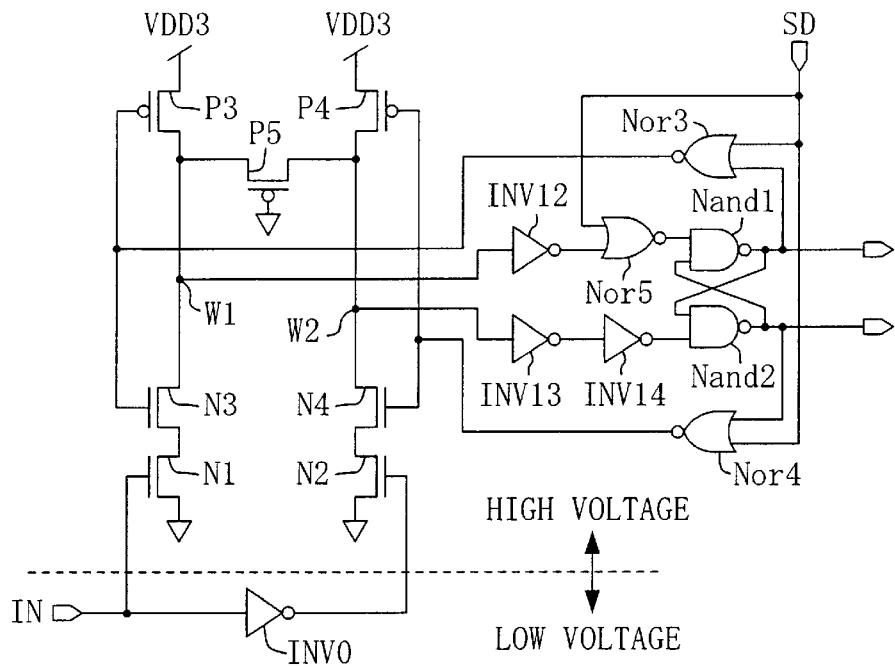
FIG. 16 is a circuit diagram illustrating yet another alternative configuration for the level shifter of the second modified example.

The level shifter shown in FIG. 16 performs the same function as the level shifters shown in FIGS. 14 and 15 using a different configuration. Specifically, in the level shifter shown in FIG. 16, an inverter INV12 and a NOR gate Nor5 are provided on the stage preceding the NAND gate Nand1 and two more inverters INV13 and INV14 are provided on the stage preceding the NAND gate Nand2. And the shutdown instruction signal, received at the terminal SD, is input to the NOR gate Nor5.

Modified Example 3

Figure 17:
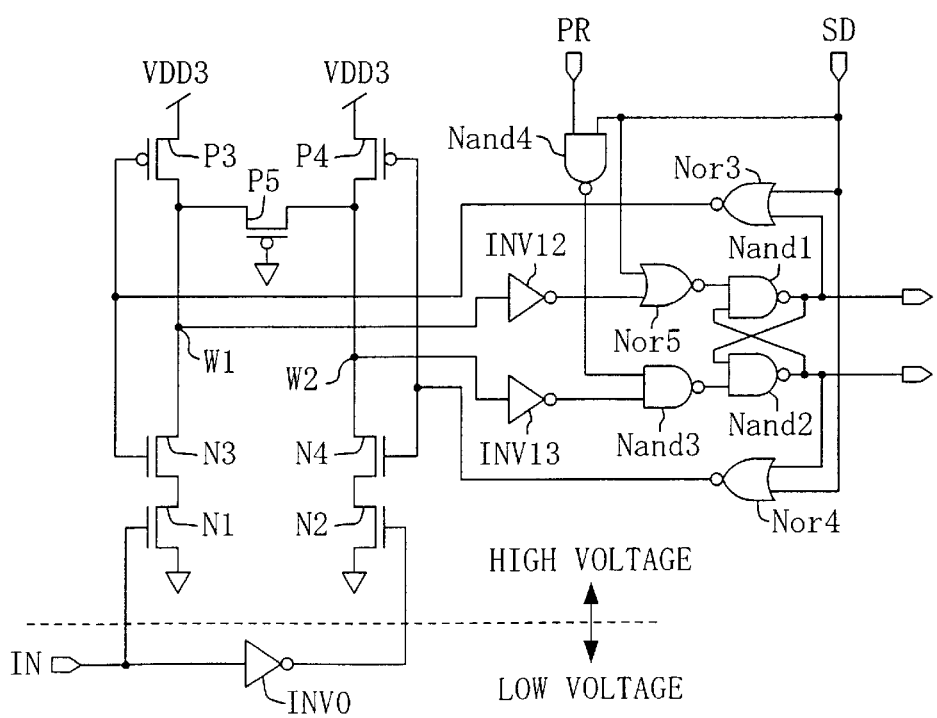
FIG. 17 is a circuit diagram illustrating a level shifter, which can output a predetermined logic level preferentially when a low voltage supply is shut down, as a third modified example for the level shifter of the second embodiment.
Figure 18:
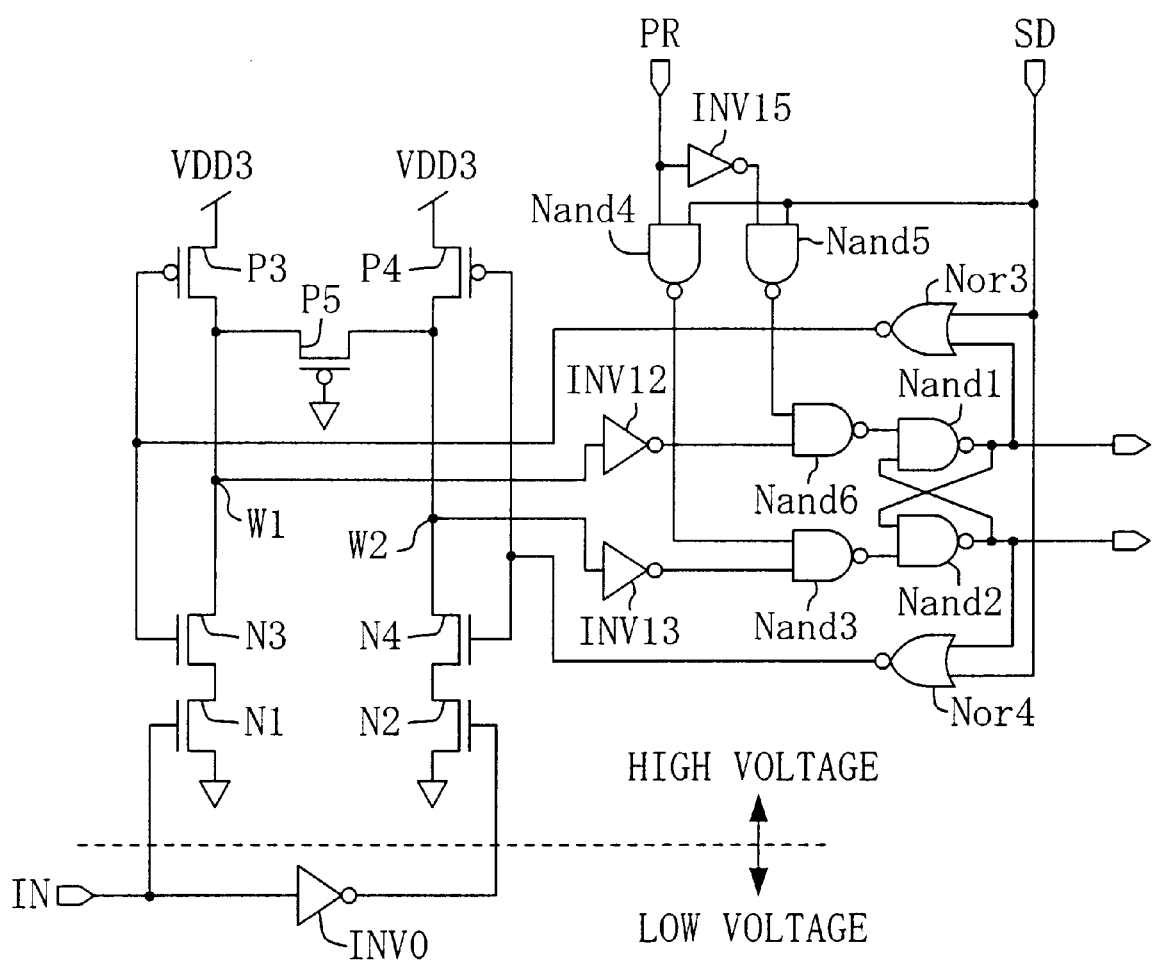
FIG. 18 is a circuit diagram illustrating an alternative configuration for the level shifter of the third modified example.

FIGS. 17 and 18 illustrate a third modified example for the second embodiment. This modified example has the capability of selecting arbitrary output logic levels for the level shifter when the low voltage supply VDD is shut down. The level shifter shown in FIG. 17 is based on the configuration shown in FIG. 16. Specifically, in the level shifter shown in FIG. 17, the inverter INV14 of the level shifter shown in FIG. 16 is replaced with a NAND gate Nand3. Also, the level shifter shown in FIG. 17 further includes another NAND gate Nand4 and another terminal PR for receiving a preference signal. The NAND gate Nand4 is supplied with the H-(VDD3) level shutdown instruction signal and preference signal from the terminals SD and PR, respectively. And the output of the NAND gate Nand4 is input to the NAND gate Nand3.

Accordingly, in the level shifter shown in FIG. 17, the preference signal at the terminal PR has its level changed into the H-(VDD3) or L-(0 V) level responsive to the shutdown instruction signal, thereby changing the output of the NAND gate Nand3 into the H- or L-level. As a result, the output logic level of the NAND gate Nand2 of the flip-flop can also be changed into the H-(VDD3) or L-(0 V) level. In the level shifter shown in FIG. 17, the output logic level of the other NAND gate Nand1 of the flip-flop is always fixed at the H(VDD3) level.

The level shifter shown in FIG. 17 may be modified into the level shifter shown in FIG. 18 so that the output logic level of the NAND gate Nand1 of the flip-flop can also be changed into the H-(VDD3) or L-(0 V) level responsive to the preference signal. Specifically, the level shifter shown in FIG. 18 includes another inverter INV15 and two NAND gates Nand5 and Nand6. The NAND gate Nand5 is supplied with the preference signal from the terminal PR by way of the inverter INV15 and with the H-(VDD3) level shutdown instruction signal from the terminal SD. The output of this NAND gate Nand5 is input to the other NAND gate Nand6.

Accordingly, in the level shifter shown in FIG. 18, the preference signal at the terminal PR has its level changed into the H-(VDD3) or L-(0 V) level, thereby changing the output logic levels of the NAND gates Nand5 and Nand6 into the H- or L-level. As a result, the output logic level of the NAND gate Nand1 of the flip-flop can also be changed into the H-(VDD3) or L-(0 V) level.

Modified Example 4

Figure 19:
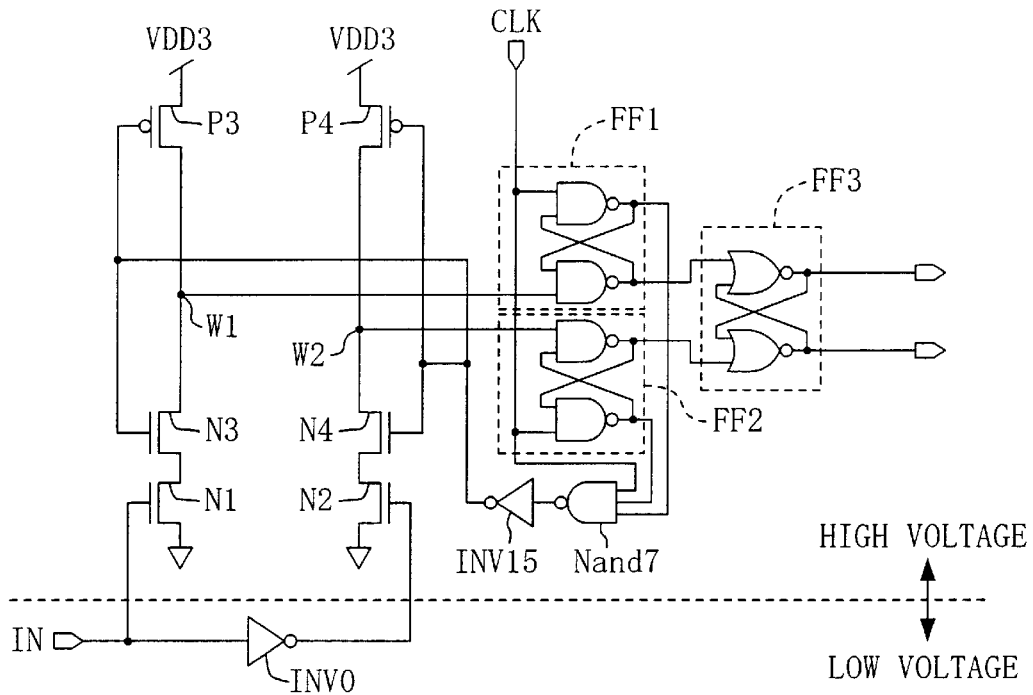
FIG. 19 is a circuit diagram illustrating an edge-triggering level shifter as a fourth modified example for the level shifter of the second embodiment.
Figure 20:
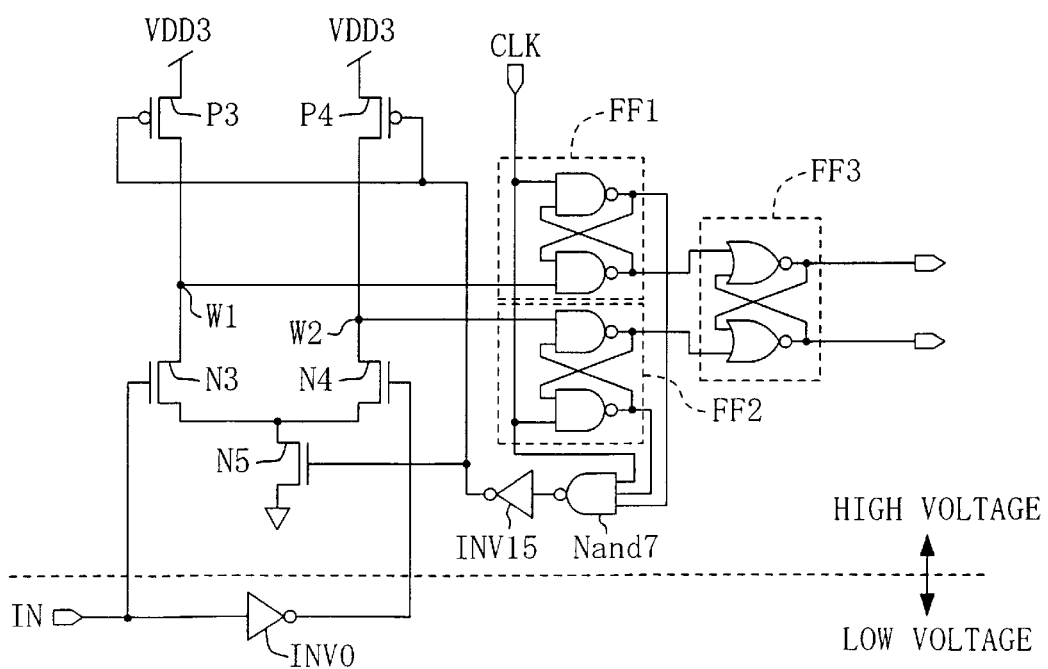
FIG. 20 is a circuit diagram illustrating an alternative configuration for the edge-triggering level shifter of the fourth modified example.
Figure 21:
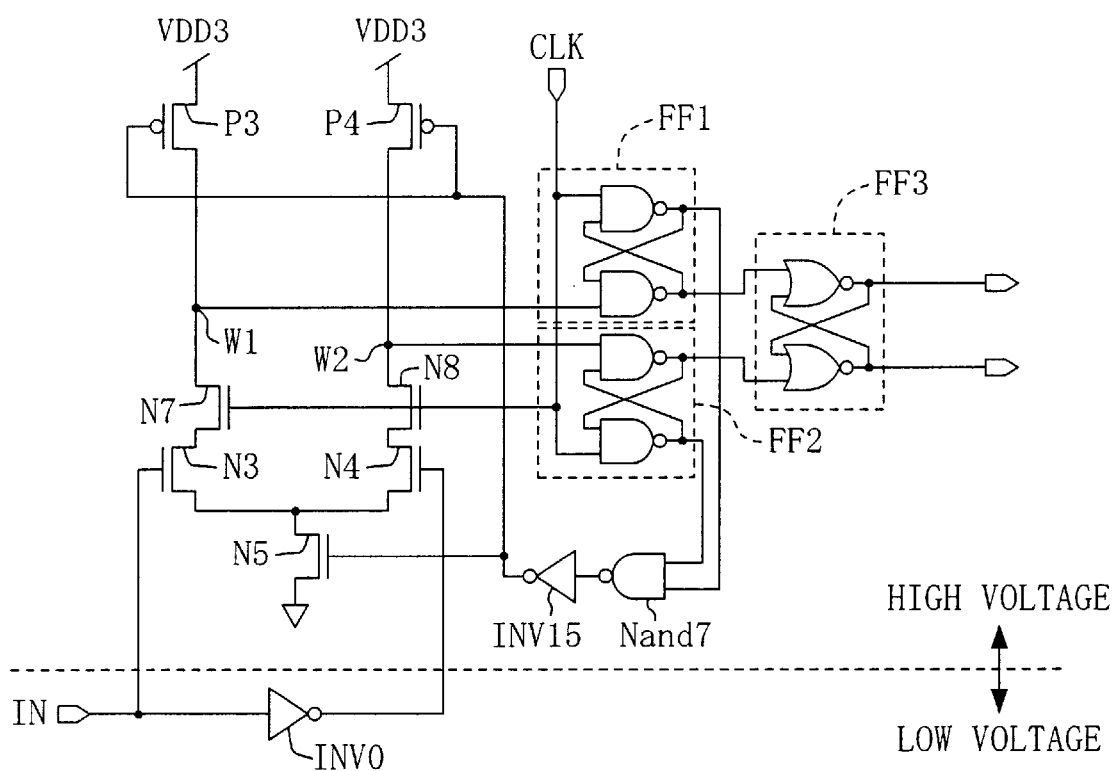
FIG. 21 is a circuit diagram illustrating another alternative configuration for the edge-triggering level shifter of the fourth modified example.

FIGS. 19 through 21 illustrate a fourth modified example for the second embodiment. This modified example relates to an edge-triggering level shifter.

The level shifter shown in FIG. 19 includes first, second and third flip-flops FF1, FF2 and FF3. The first flip-flop FF1 receives a clock signal CLK and a potential at the first node W1. The second flip-flop FF2 receives the clock signal CLK and a potential at the second node W2. And the third flip-flop FF3 receives the outputs of these flip-flops FF1 and FF2.

In the level shifter shown in FIG. 19, while the clock signal CLK is at the L-level, the first and second flip-flops FF1 and FF2 are reset. The pre-charge circuit B pre-charges the first and second nodes W1 and W2 to the level of the high voltage supply VDD3 using a NAND gate Nand7 and an inverter INV15. The third flip-flop FF3 maintains the current level. When the clock signal CLK changes into the H-level after that, the NAND gate Nand7 and inverter INV15 turn the p-channel transistors P3 and P4 OFF to stop the pre-charging. Also, the n-channel transistors N3 and N4 turn ON, thereby dropping the potential level at the first or second node W1 or W2 to the L-(0 V) level in accordance with the level of the input signal at the terminal IN. And the L-level potential at the first or second node W1 or W2 is latched in the first or second flip-flop FF1 or FF2, and the logic levels of the other flip-flop FF3 are set. When this latching is over, the pre-charge circuit B pre-charges again the first and second nodes W1 and W2 to the level of the high voltage supply VDD3 using the NAND gate Nand7 and inverter INV15.

The level shifter shown in FIG. 20 is a modification to the counterpart shown in FIG. 19. Specifically, in the level shifter shown in FIG. 20, the two n-channel transistors N3 and N4 of the level shifter shown in FIG. 19 are connected in common to one n-channel transistor N5.

The level shifter shown in FIG. 21 is a partial modification to the counterpart shown in FIG. 20. Specifically, another pair of n-channel transistors N7 and N8 are disposed between the first node W1 and n-channel transistor N3 and between the second node W2 and n-channel transistor N4, respectively, and are controlled responsive to the clock signal CLK. In this configuration, when the clock signal CLK rises to the H-level, these n-channel transistors N7 and N8 turn ON, thereby changing the logic level at the first or second node W1 or W2 in accordance with the level of the input signal at the terminal IN.

Modified Example 5

Figure 22:
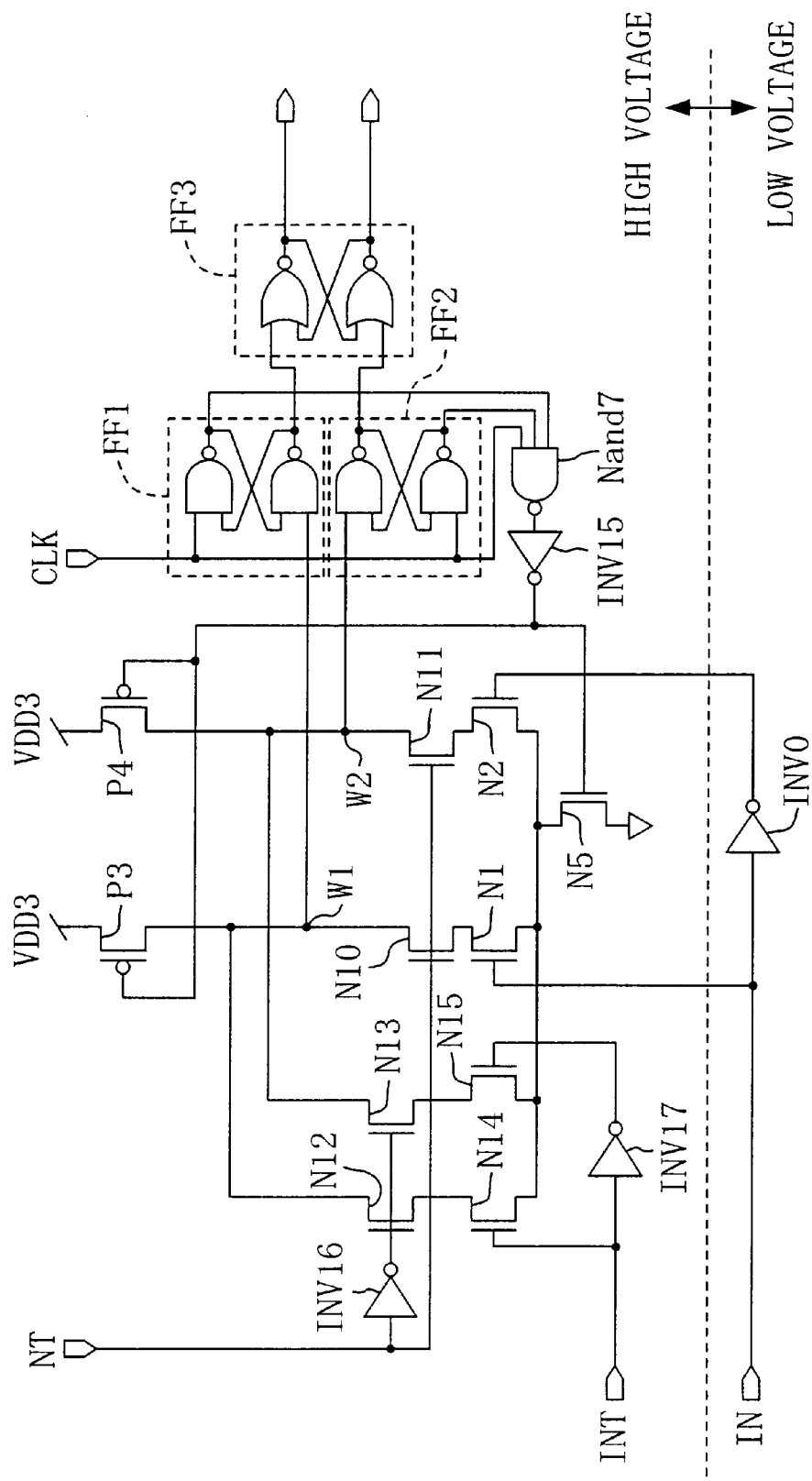
FIG. 22 is a circuit diagram illustrating an edge-triggering level shifter with a test mode function as a fifth modified example for the level shifter of the second embodiment.
Figure 23:
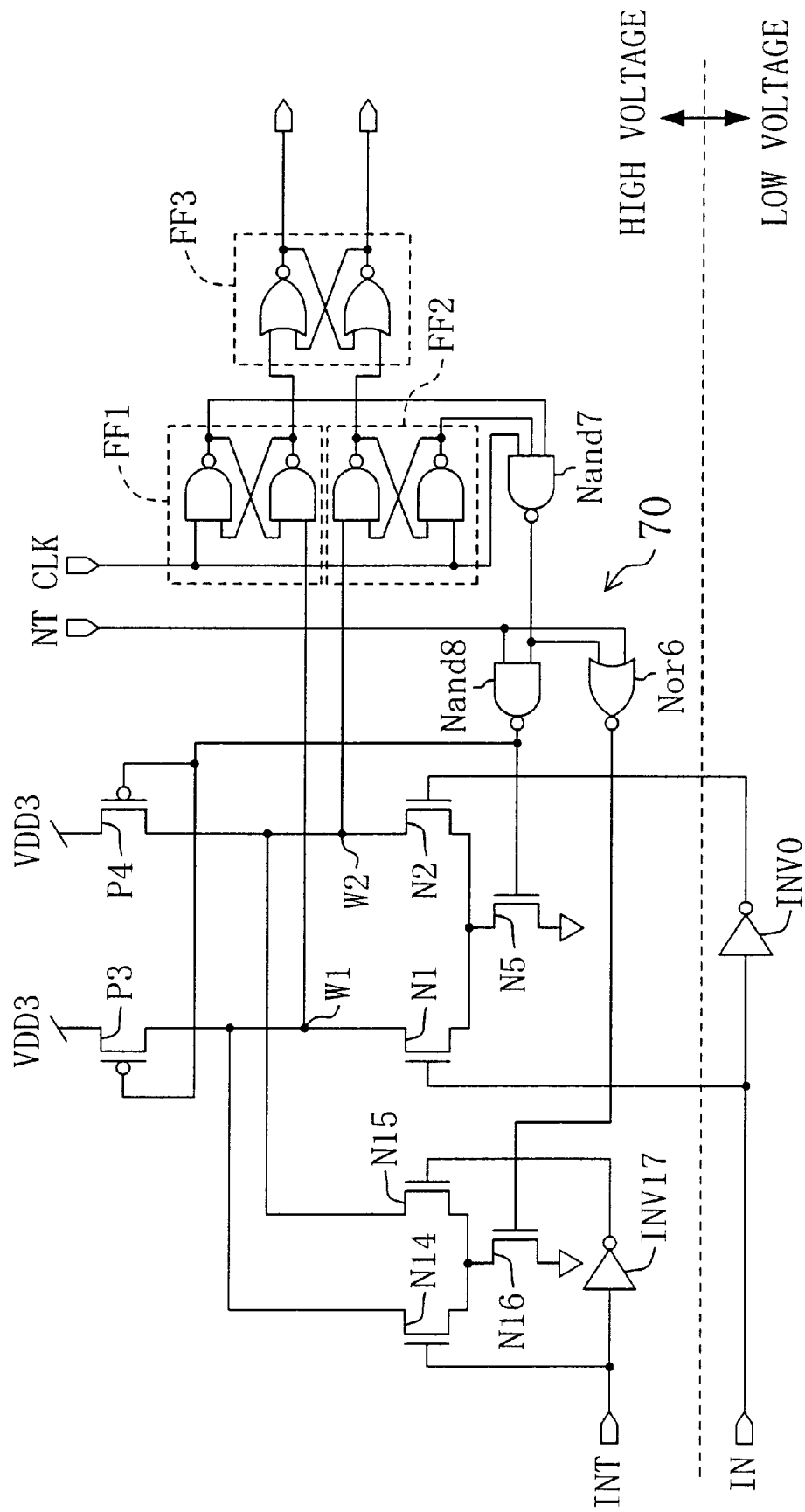
FIG. 23 is a circuit diagram illustrating an alternative configuration for the edge-triggering level shifter with the test mode function of the fifth modified example.

FIGS. 22 and 23 illustrate a fifth modified example for the second embodiment. This is a modification to the edge-triggering level shifter shown in FIG. 21 and additionally has a test mode function.

When the level shifter shown in FIG. 22 should be tested, an L-level test mode signal is input to a terminal NT. In response, n-channel transistors N10 and N11 turn OFF and the n-channel transistors N1 and N2 (operating responsive to a normal mode input signal at the terminal IN) are electrically isolated from the p-channel transistors P3 and P4. The test mode signal is inverted by an inverter INV16. In response to that inverted version of the test mode signal, n-channel transistors N12 and N13 for test mode turn ON. A test signal is also input to a terminal INT and then inverted by an inverter INV17. In response to the test signal and its inverted version, n-channel transistors N14 and N15 are connected to the p-channel transistors P3 and P4, respectively, by way of the n-channel transistors N12 and N13 in ON state. In this manner, the logic levels at the first and second nodes W1 and W2 can be changed responsive to the test signal at the terminal INT in the test mode.

The level shifter shown in FIG. 23 is a modification to the counterpart shown in FIG. 22. Specifically, the level shifter shown in FIG. 23 includes another n-channel transistor N16 for grounding the n-channel transistors N14 and N15 for test mode as well as the n-channel transistor N5 for grounding the n-channel transistors N1 and N2 for normal mode. In response to the L-level test mode signal received at the terminal NT, the output levels of NAND and NOR gates Nand8 and Nor6 are controlled. In the normal mode, the ON/OFF states of the n-channel transistor N5 for normal mode are controlled in accordance with the output logic level of the NAND gate Nand8 of the pre-charge controller 70. In the test mode on the other hand, the ON/OFF states of the n-channel transistor N16 for test mode are controlled in accordance with the output logic level of the NOR gate Nor6 of the pre-charge controller 70.

Modified Example 6

Figure 24:
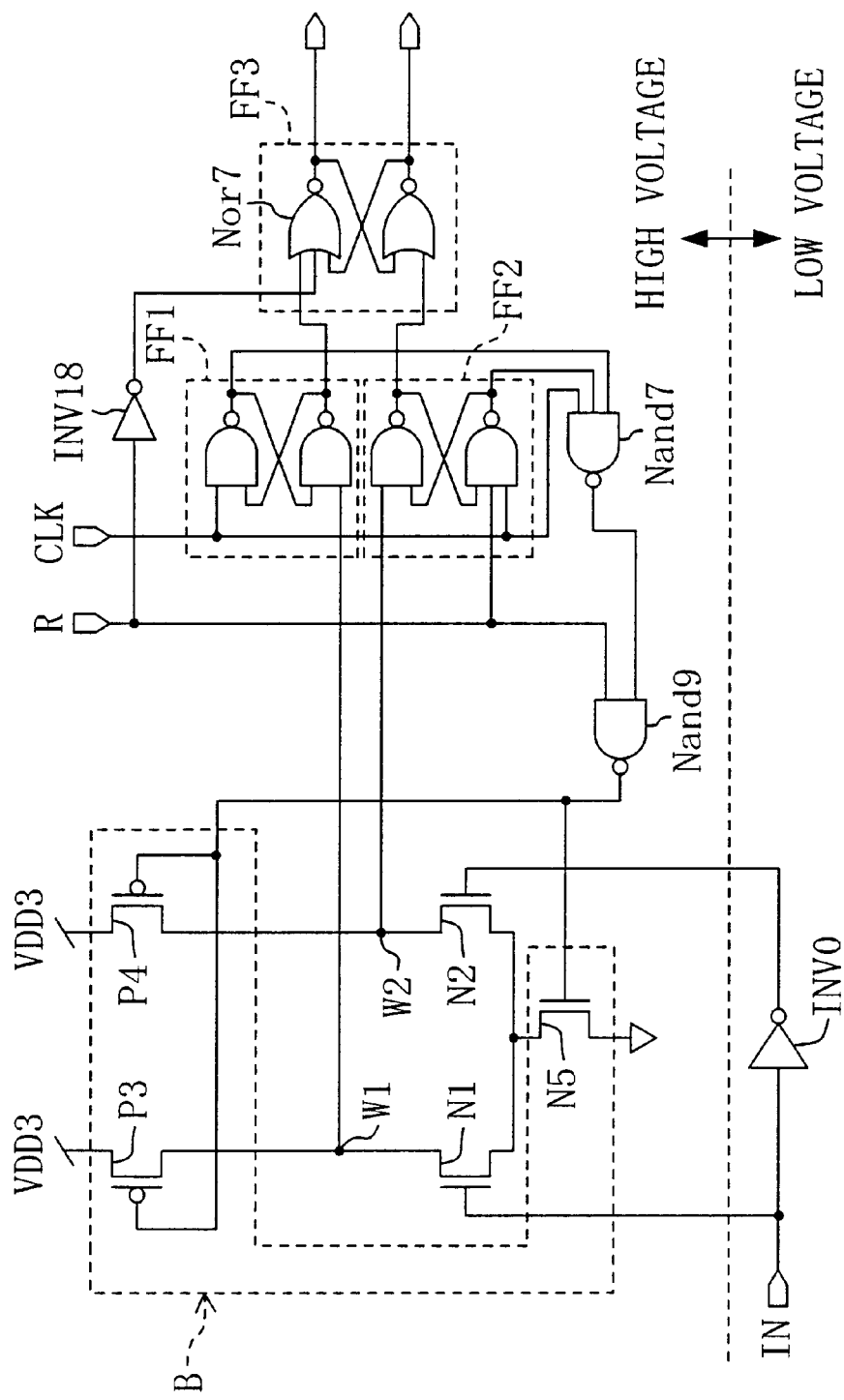
FIG. 24 is a circuit diagram illustrating an edge-triggering level shifter with a reset function as a sixth modified example for the level shifter of the second embodiment.
Figure 25:
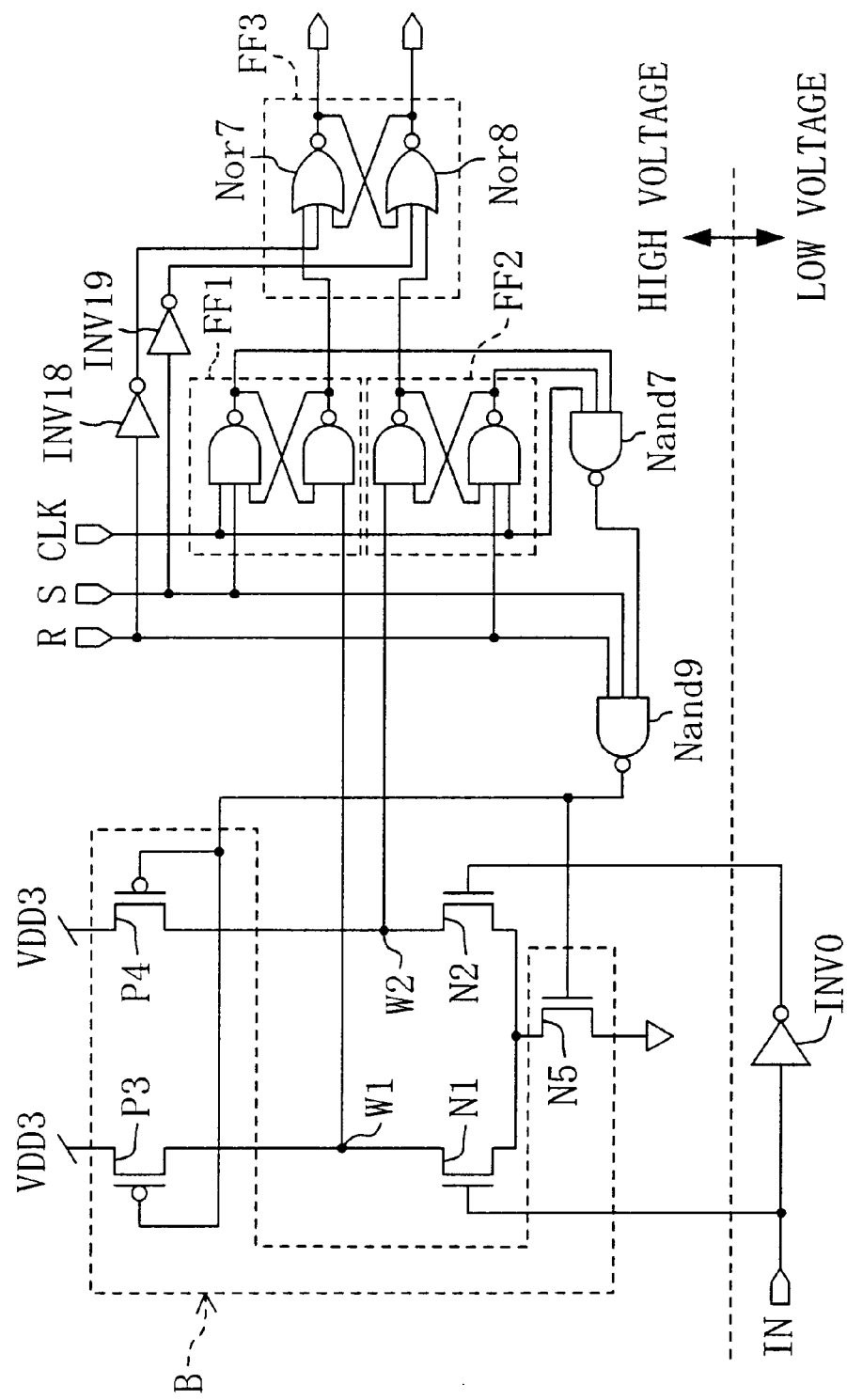
FIG. 25 is a circuit diagram illustrating an edge-triggering level shifter, which has not only the reset function but also a set function, according to the sixth modified example.

FIGS. 24 and 25 illustrate a sixth modified example for the second embodiment.

The level shifter shown in FIG. 24 is a modification to the edge-triggering level shifter shown in FIG. 20 and further has a reset function.

Specifically, in the level shifter shown in FIG. 24, a reset signal is input to a reset terminal R and then to the NOR gate Nor7 in the flip-flop FF3 by way of an inverter INV18, thereby fixing the output logic level of the NOR gate Nor7. The reset signal is also input to a NAND gate Nand9 so that the pre-charge circuit B can pre-charge the first and second nodes W1 and W2 to the level of the high voltage supply VDD3.

The level shifter shown in FIG. 25 is a modification to the counterpart shown in FIG. 24 and further has a set function. Specifically, in the level shifter shown in FIG. 25, a set signal is input to a set terminal S and then to the NOR gate Nor8 in the flip-flop FF3 by way of an inverter INV19, thereby fixing the output logic level of the NOR gate Nor8. The set signal is also input to the NAND gate Nand9 so that the pre-charge circuit B can pre-charge the first and second nodes W1 and W2 to the level of the high voltage supply VDD3.

Modified Example 7

Figure 26:
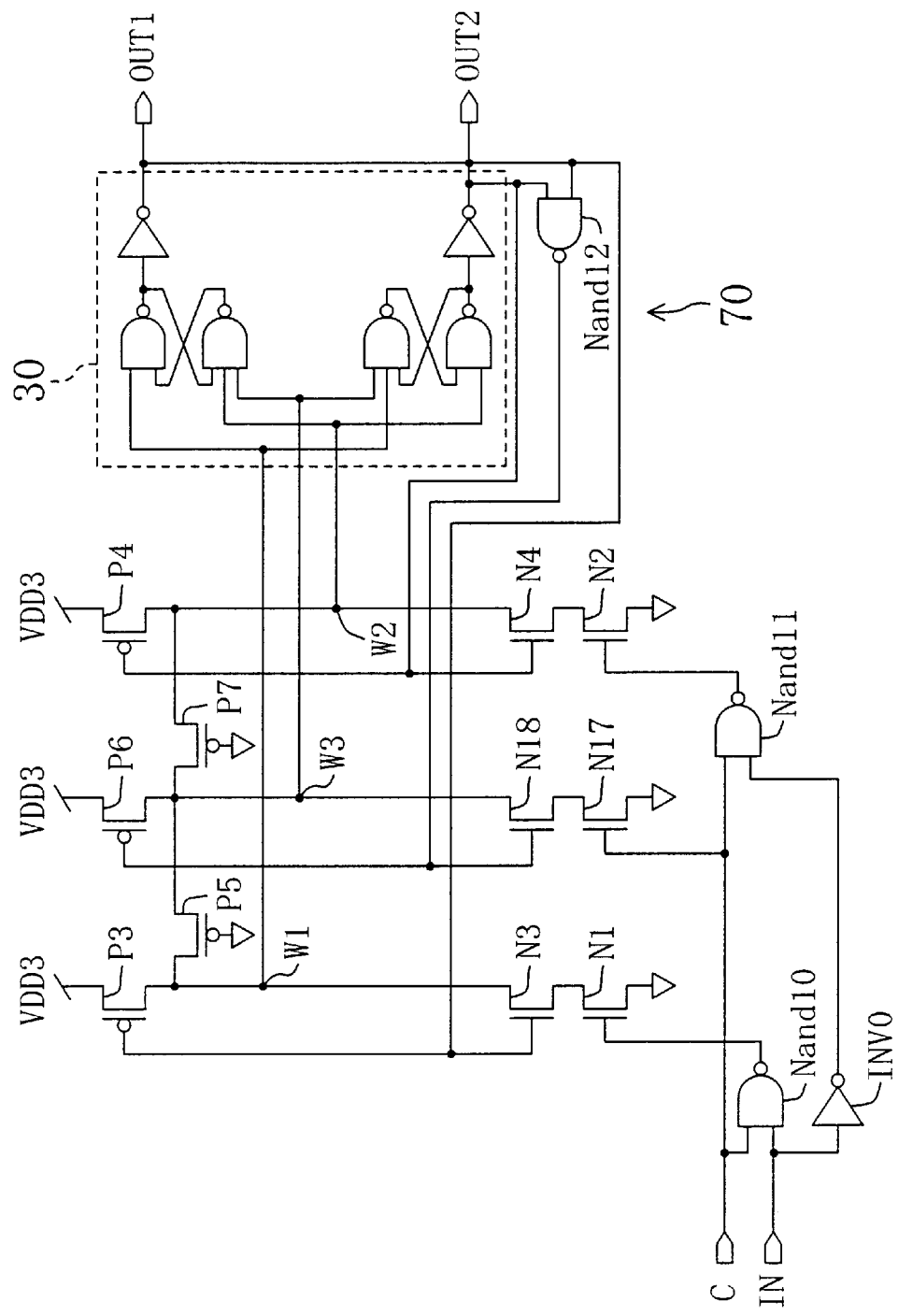
FIG. 26 is a circuit diagram illustrating a tristate level shifter as a seventh modified example for the level shifter of the second embodiment.

FIG. 26 illustrates a seventh modified example for the second embodiment. This modified example relates to a tristate level shifter.

In the level shifter shown in FIG. 26, the combinations of output levels at output terminals OUT1 and OUT2 include not only (H, L) and (L, H) but also (H, H). Specifically, the level shifter further includes another n-channel transistor N17 for the pair of n-channel transistors N1 and N2, another p-channel transistor P6 for the pair of p-channel transistors P3 and P4 and another n-channel transistor N18 for the pair of n-channel transistors N3 and N4. Furthermore, another p-channel transistor P7 is provided as a resistor in addition to the p-channel transistor P5.

In a normal mode, an input signal at a terminal C is changed into the L-(0 V) level, thereby turning the n-channel transistor N18 OFF and keeping a node W3 pre-charged. In this state, responsive to the input signal at the terminal IN and its inverted version, the n-channel transistors N1 and N2 are turned ON or OFF by way of NAND gates Nand10 and Nand11. And the control circuit 30 sets the logic levels at the output terminals OUT1 and OUT2 to (H, L) or (L, H). On the other hand, when the logic levels at the output terminals OUT1 and OUT2 should be controlled to (H, H), the input signal at the terminal C is changed into the H-(VDD3) level. In this manner, the n-channel transistor N17 is turned ON and the potential level at the node W3 is dropped to the L-(0 V) level. And responsive to the potential drop at the node W3, the control circuit 30 sets the logic levels at the output terminals OUT1 and OUT2 to (H, H). In this modified example, a NAND gate Nand12 functions as the pre-charge controller 70 for controlling the pre-charge of the nodes W1, W2 and W3.

Modified Example 8

Figure 27:
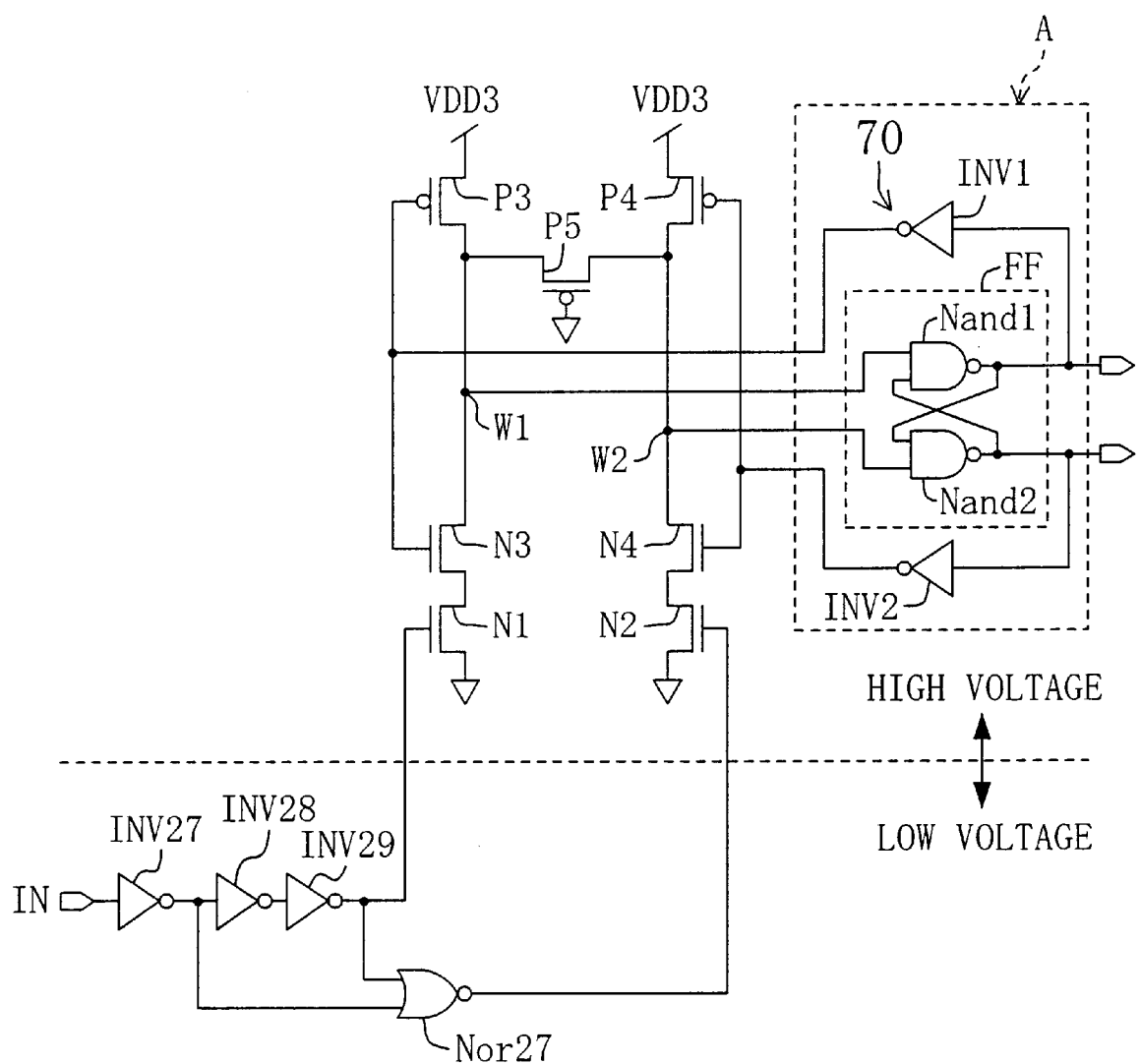
FIG. 27 is a circuit diagram illustrating an eighth modified example for the level shifter of the second embodiment.
Figure 28:
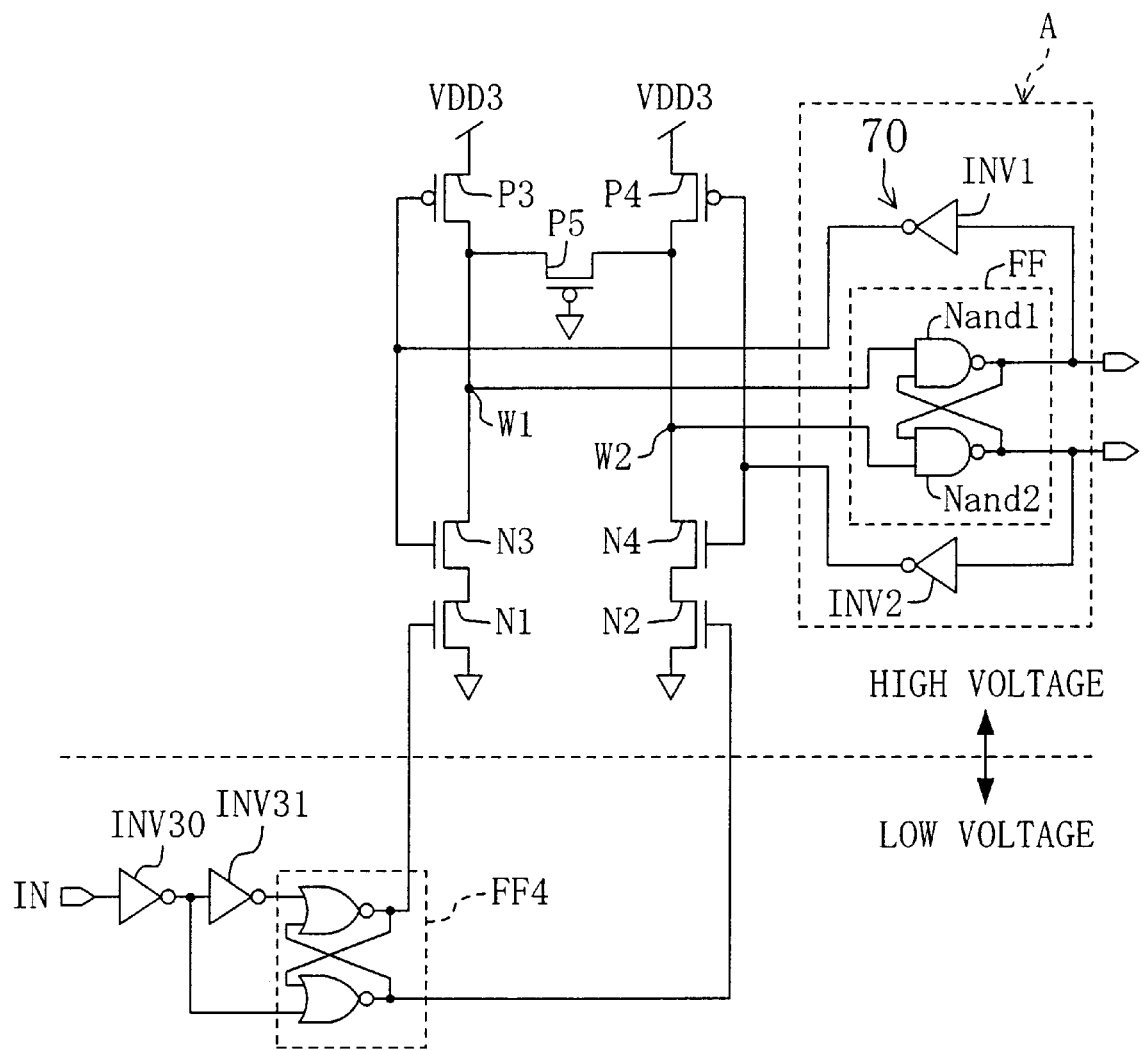
FIG. 28 is a circuit diagram illustrating an alternative configuration for the level shifter of the eighth modified example.
Figure 29:
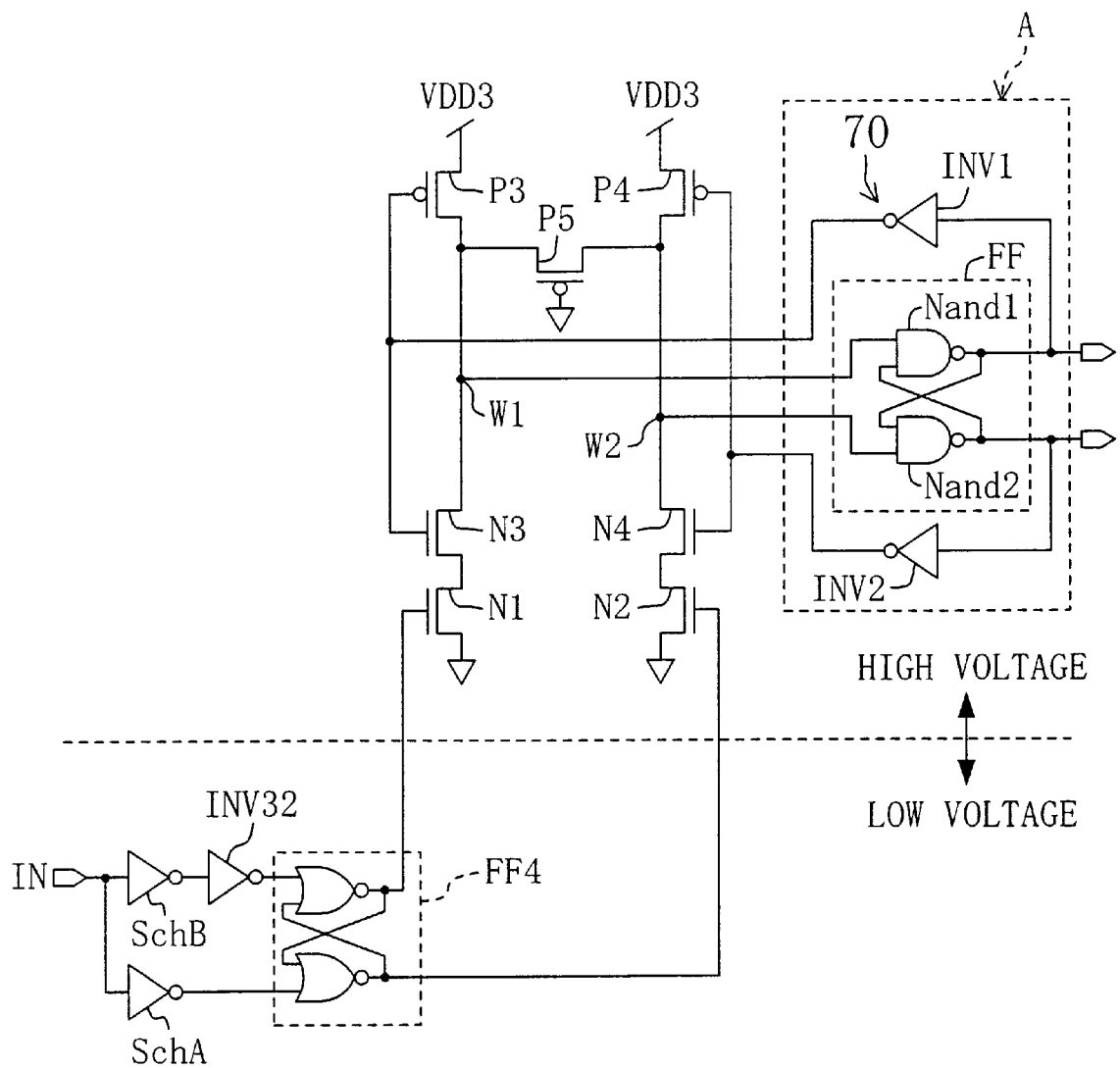
FIG. 29 is a circuit diagram illustrating another alternative configuration for the level shifter of the eighth modified example.

FIGS. 27 through 29 illustrate an eighth modified example for the second embodiment.

Figure 31:
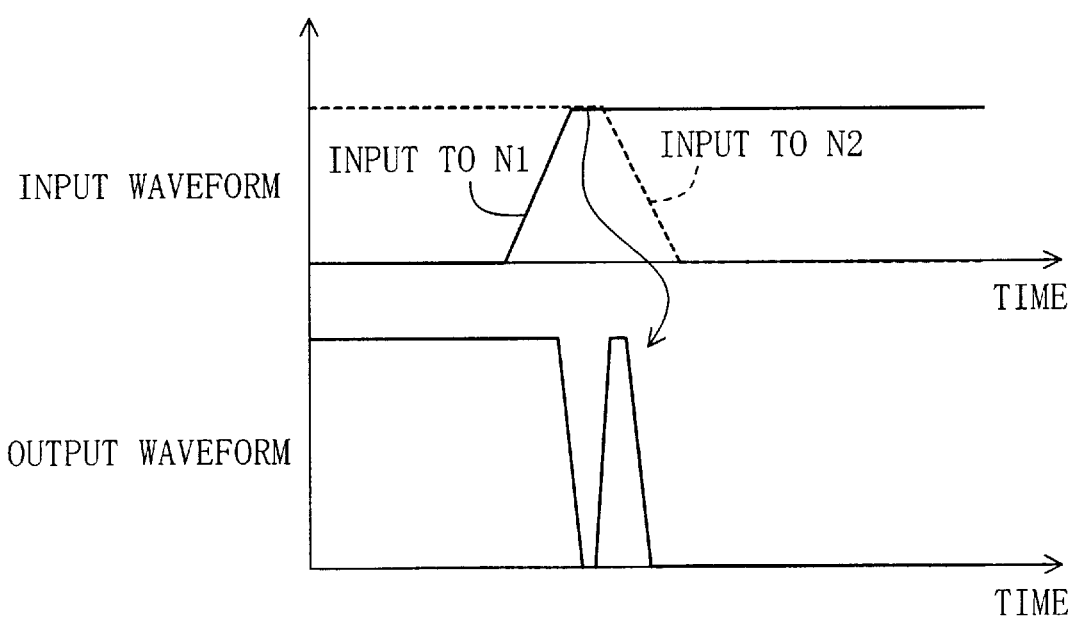
FIG. 31 is a timing diagram illustrating input and output waveforms that the level shifter of the second embodiment may have.
Figure 32:
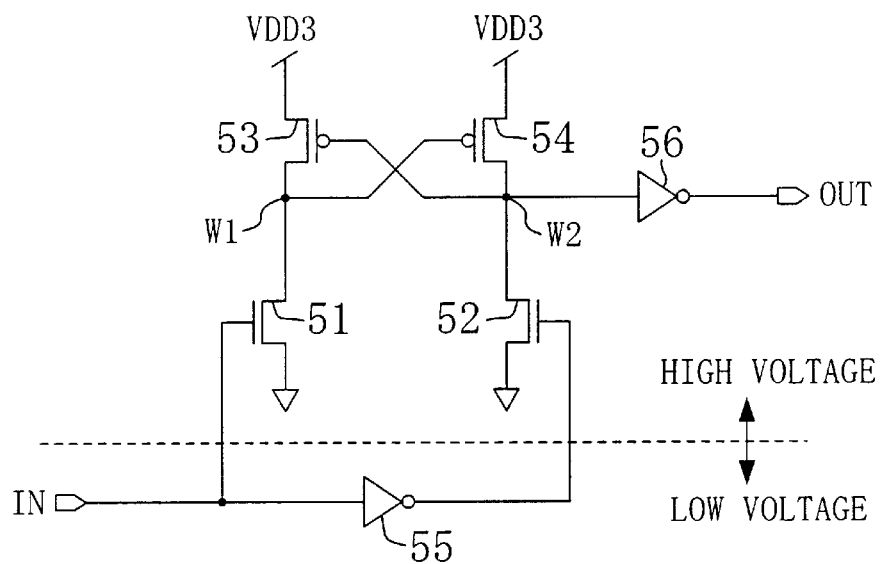
FIG. 32 is a circuit diagram illustrating a known level shifter.
Figure 33:
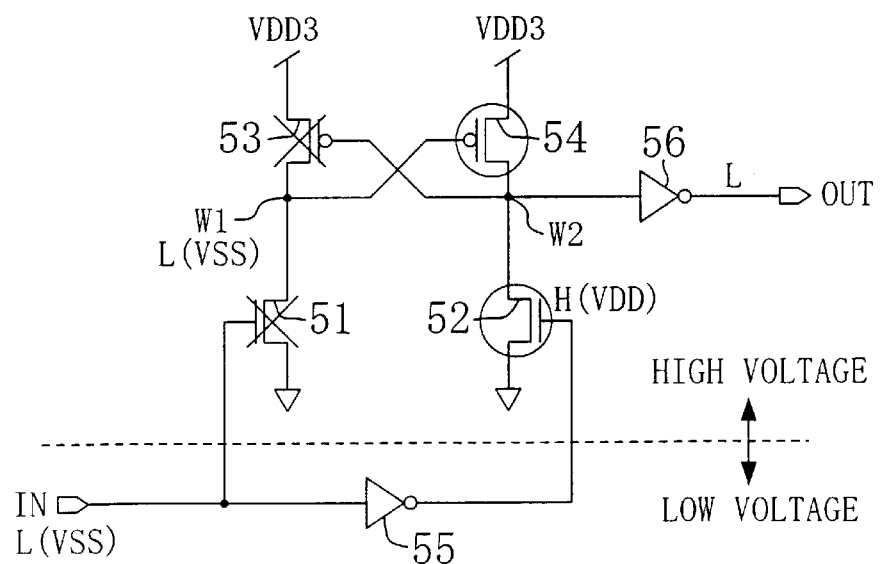
FIG. 33 is a circuit diagram illustrating a current flowing through the known level shifter during its operation.
Figure 34:
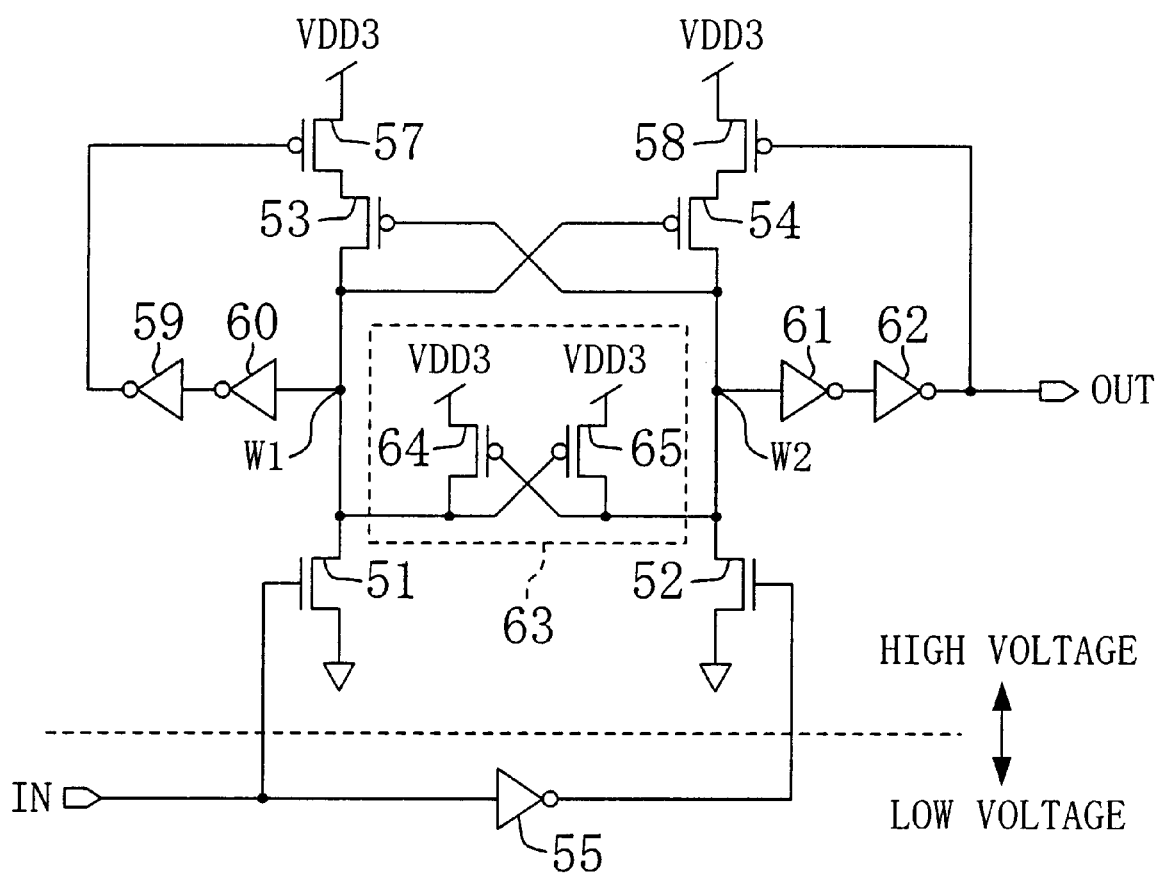
FIG. 34 is a circuit diagram illustrating another known level shifter.

This example is a modification to the level shifter shown in FIG. 8 and includes a different circuit section for generating complementary signals to be input to the n-channel transistors N1 and N2. In the level shifter shown in FIG. 8, the delay caused by the control circuit A might be shorter than the delay caused by the inverter INV0 powered by the low voltage supply VDD. That is to say, a time it takes to set the flip-flop FF and to pre-charge the nodes W1 and W2 to the level of the high voltage supply VDD3 after the input signal changed its level might be shorter than the delay caused by the inverter INV0. In that situation, the first and second nodes W1 and W2 to be pre-charged might be discharged erroneously. That is to say, if the interval, in which the signals input to the n-channel transistors N1 and N2 are both at the H-level, is long, then the delay caused by the control circuit A might be short as shown in FIG. 31. In that case, the first and second nodes W1 and W2 might be charged and discharged alternately. As a result, a pulsed waveform might be unintentionally output through the output terminal. This erroneous operation very likely occurs at the trailing edge of the input signal particularly if the input and output sections are made up of high-voltage transistors and low-voltage transistors, respectively, and if the delay caused by the high-voltage transistors is much longer than that caused by the low-voltage transistors. To avoid such an erroneous operation, this modified example prevents the complementary signals for the n-channel transistors N1 and N2 from being asserted at a time. That is to say, it is not until one of those complementary signals has fallen to the L-level that the other signal is allowed to rise to the H-level.

The level shifter shown in FIG. 27 includes an inverter INV27, a delay circuit consisting of two more inverters INV28 and INV29 and a NOR gate Nor27 in place of the inverter INV0 shown in FIG. 8. The NOR gate Nor27 receives the output of the inverters INV27 and INV29. Using these devices, the level shifter shown in FIG. 27 generates the complementary input signals.

The level shifter shown in FIG. 28 generates the complementary input signals using two inverters INV30 and INV31 and a flip-flop FF4.

Figure 30:
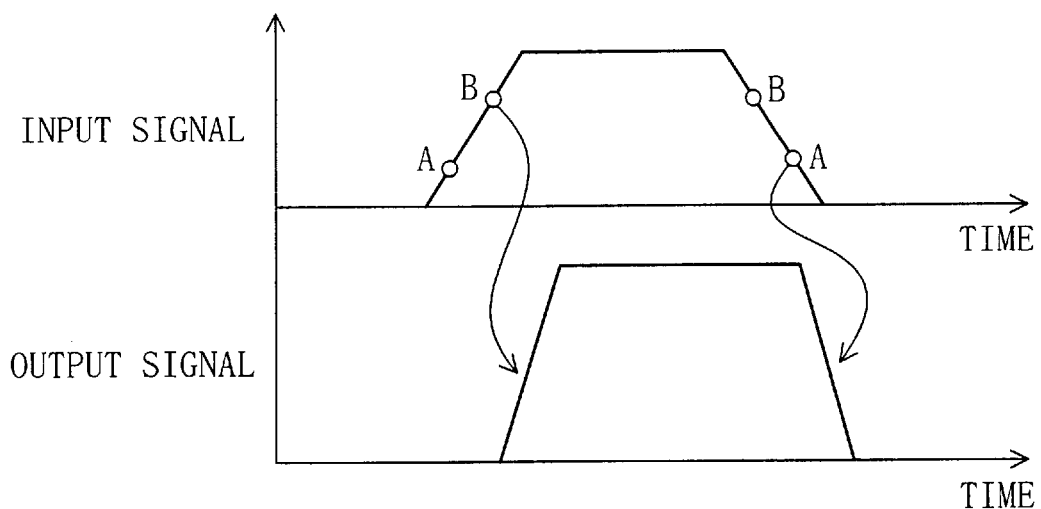
FIG. 30 is a timing diagram illustrating how the level shifter of the second embodiment operates.

The level shifter shown in FIG. 29 generates the complementary input signals using two Schmitt circuits SchA and SchB, inverter INV32 and flip-flop FF4. As shown in FIG. 30, the switching level of one Schmitt circuit SchA is set relatively low, while that of the other Schmitt circuit SchB is set relatively high.

In the foregoing embodiments, the present invention has been described as being applied to a level shifter for translating a logic level corresponding to a low voltage into a logic level corresponding to a high voltage. However, the present invention is in no way limited to such a level shifter, but is naturally applicable to a level shifter for translating a logic level corresponding to a high voltage into a logic level corresponding to a low voltage. In that case, the first and second voltage supplies will be high and low voltage supplies, respectively.

What is claimed is:

1. A level shifter comprising:

first and second n-channel transistors, each including first, second and control terminals, the first and second n-channel transistors receiving an input signal and its complementary signal at their respective control terminals and being powered by a first voltage supply, the first terminals of the first and second n-channel transistors being grounded, the second terminals of the first and second n-channel transistors being connected to first and second nodes, respectively;

first and second cross-coupled p-channel transistors, each including first, second and control terminals, the first terminals of the first and second p-channel transistors being connected to a second voltage supply, the second terminals of the first and second p-channel transistors being connected to the first and second nodes, respectively;

a current interrupting section for interrupting a short-circuit current by disconnecting the first or second p-channel transistor from the second voltage supply when the input signal changes its level; and at least one resistor for connecting the second voltage supply to the first or second node while the input signal is in a steady state, wherein the current interrupting section comprises:

a third p-channel transistor disposed between the second voltage supply and the first p-channel transistor; and a fourth p-channel transistor disposed between the second voltage supply and the second p-channel transistor, and wherein the resistor is a transistor connected to third and fourth nodes, the first and third p-channel transistors being connected together at the third node, the second and fourth p-channel transistors being connected together at the fourth node.

2. The shifter of claim 1, which fixes the second node at a predetermined potential level when the first voltage supply is shut down.

3. The shifter of claim 1, wherein the resistor comprises:

a first resistor disposed between the second voltage supply and the third node; and a second resistor disposed between the second voltage supply and the fourth node.

4. The shifter of claim 3, wherein the first resistor is a p-channel transistor, which is controlled by a potential level at the second node, and wherein the second resistor is a p-channel transistor, which is controlled by a potential level obtained by inverting the potential level at the second node.

5. The shifter of claim 1 or 3, wherein each said resistor has a high resistance value so that a current, flowing from the second voltage supply through the resistor itself, has a value almost equal to zero.

6. The shifter of claim 1, further comprising a next-stage inverter connected to the second node, wherein gate capacitances of the next-stage inverter and the first p-channel transistor are set sufficiently small as to allow the potential level at the second node to fall rapidly.

7. The shifter of claim 1, wherein the second and fourth p-channel transistors have such a size as allowing the potential level at the second node to rise quickly.

8. A level shifter comprising:

first and second transistors, each including first, second and control terminals, the first and second transistors receiving an input signal and its complementary signal at their respective control terminals and being powered by a first voltage supply, the first terminals of the first and second transistors being grounded, the second terminals of the first and second transistors being connected to first and second nodes, respectively;

a pre-charge circuit for pre-charging the first and second nodes to a voltage level of a second voltage supply;

a level detector for detecting a potential drop at the first and second nodes; and a pre-charge controller for controlling the pre-charge circuit, wherein the level detector is a flip-flop connected to the first and second nodes.

9. The shifter of claim 8, wherein the level detector resets output logic levels responsive to a reset signal.

10. The shifter of claim 8, wherein on receiving a control signal as well as the input signal, the outputs of the level detector are changeable among three levels.

11. The shifter of claim 8, wherein the level detector has a switching level so as to detect the potential drop at the first and second nodes rapidly.

12. The shifter of claim 8, wherein in the level detector, capacitances of gates connected to the first and second nodes are set sufficiently small so as to allow the potential level at the first and second nodes to fall rapidly.

13. The shifter of claim 8, wherein the pre-charge circuit comprises:

a supply circuit for connecting the second voltage supply to the first and second nodes; and an interrupter for disconnecting or connecting the first and second nodes from/to the ground.

14. The shifter of claim 13, wherein the supply circuit comprises:

a first p-channel transistor disposed between the second voltage supply and the first node; and a second p-channel transistor disposed between the second voltage supply and the second node, and wherein the interrupter comprises:

a first n-channel transistor disposed between the first node and the ground; and a second n-channel transistor disposed between the second node and the ground.

15. The shifter of claim 8 or 13, wherein in a steady state in which the input signal has a constant level, the pre-charge controller instructs the pre-charge circuit i) to pre-charge the first or second node, which is connected to the first or second transistor that is in OFF state, to the voltage level of the second voltage supply and ii) to disconnect the second voltage supply from the node being pre-charged, and wherein in a level transition state in which the input signal changes its level, the instant the level detector detects the level, the pre-charge controller instructs the pre-charge circuit i) to disconnect the first or second node pre-charged from the ground, ii) to connect the second voltage supply to the disconnected node and iii) to pre-charge the node to the voltage level of the second voltage supply.

16. The shifter of claim 14, wherein in a steady state in which the input signal has a constant level, the pre-charge controller turns OFF the first or second p-channel transistor, which is associated with the first or second transistor that is in OFF state, and turns ON the first or second n-channel transistor, which is also associated with the first or second transistor in the OFF state, and wherein in a level transition state in which the input signal changes its level, the instant the level detector detects the level, the pre-charge controller turns the associated first or second p-channel transistor ON and the associated first or second n-channel transistor OFF.

17. The shifter of claim 8, further comprising a resistor for connecting the second voltage supply to the first or second node in a steady state in which the input signal has a constant level.

18. The shifter of claim 17, wherein the resistor has a high resistance value so that a current, flowing from the second voltage supply through the resistor itself, has a value almost equal to zero.

19. The shifter of claim 8, wherein when the first voltage supply is shut down, the level detector fixes output logic levels responsive to a shutdown instruction signal.

20. The shifter of claim 19, wherein when the first voltage supply is shut down, the level detector is able to arbitrarily select the output logic levels to be fixed responsive to a preference signal.

21. The shifter of claim 8, wherein the level detector has an edge triggering function of detecting the potential drop at the first or second node when a clock signal changes its level.

22. The shifter of claim 8, wherein in a test mode, the level detector receives a test signal instead of the input signal and detects the potential drop responsive to the test signal.

23. The shifter of claim 8 or 9, wherein the level detector sets the output logic levels responsive to a set signal.

24. A level shifter comprising:
first and second transistors, each including first, second and control terminals, the first and second transistors receiving an input signal and its complementary signal at their respective control terminals and being powered by a first voltage supply, the first terminals of the first and second transistors being grounded, the second terminals of the first and second transistors being connected to first and second nodes, respectively;
a pre-charge circuit for pre-charging the first and second nodes to a voltage level of a second voltage supply;
a level detector for detecting a potential drop at the first and second nodes;
a pre-charge controller for controlling the pre-charge circuit, and
a resistor having a first terminal coupled to said first node and a second terminal coupled to said second node.

25. The shifter of claim 24, wherein upon receiving a control signal as well as the input signal, the outputs of the level detector are changeable among three levels.

26. The shifter of claim 24, wherein both the first node and the second node are charged to the value of the second voltage supply when the shifter is in a steady state.

27. The level shifter of claim 24, wherein said resistor is a transistor.

28. The shifter of claim 24, wherein the level detector is a flip-flop connected to the first and second nodes.

29. The shifter of claim 24, wherein the pre-charge circuit comprises:
a supply circuit for connecting the second voltage supply to the first and second nodes; and
an interrupter for disconnecting or connecting the first and second nodes from/to the ground.

30. The shifter of claim 29, wherein the supply circuit comprises:
a first p-channel transistor disposed between the second voltage supply and the first node; and
a second p-channel transistor disposed between the second voltage supply and the second node, and wherein the interrupter comprises:
a first n-channel transistor disposed between the first node and the ground; and
a second n-channel transistor disposed between the second node and the ground.

31. The shifter of claim 24, wherein the resistor has a high resistance value so that a current, flowing from the second voltage supply through the resistor itself, has a value almost equal to zero.

32. The shifter of claim 24, wherein the level detector resets output logic levels responsive to a reset signal.

33. A level shifter comprising:
first and second transistors, each including first, second and control terminals, the first and second transistors receiving an input signal and its complementary signal at their respective control terminals and being powered by a first voltage supply, the first terminals of the first and second transistors being grounded, the second terminals of the first and second transistors being connected to first and second nodes, respectively;
a pre-charge circuit for pre-charging the first and second nodes to a voltage level of a second voltage supply, said pre-charge circuit including a first switch having a first terminal coupled to said second voltage supply and a second terminal coupled to said first node, and a second switch having a first terminal coupled to said second voltage supply and a second terminal coupled to said second node,
a level detector for detecting a potential drop at the first and second nodes;
a pre-charge controller for controlling the pre-charge circuit, and
a resistor having a first terminal coupled to said second terminal of said first switch and a second terminal coupled to said second terminal of said second switch.

34. The shifter of claim 33, wherein upon receiving a control signal as well as the input signal, the outputs of the level detector are changeable among three levels.

35. The shifter of claim 33, wherein both the first node and the second node are charged to the value of the second voltage supply when the shifter is in a steady state.

36. The level shifter of claim 33, wherein said resistor is a transistor.

37. The shifter of claim 33, wherein the level detector is a flip-flop connected to the first and second nodes.

38. The shifter of claim 33, wherein the pre-charge circuit comprises:
an interrupter for disconnecting or connecting the first and second nodes from/to the ground.

39. The shifter of claim 38, wherein the interrupter comprises:
a first n-channel transistor disposed between the first node and the ground; and
a second n-channel transistor disposed between the second node and the ground.

40. The shifter of claim 33, wherein the resistor has a high resistance value so that a current, flowing from the second voltage supply through the resistor itself, has a value almost equal to zero.

41. The shifter of claim 33, wherein the level detector resets output logic levels responsive to a reset signal.

* * * * *